United States Patent
Shikata et al.

(10) Patent No.: US 9,990,998 B2
(45) Date of Patent: Jun. 5, 2018

(54) SEMICONDUCTOR MEMORY DEVICE AND MEMORY SYSTEM

(71) Applicant: TOSHIBA MEMORY CORPORATION, Tokyo (JP)

(72) Inventors: Go Shikata, Moriya Ibaraki (JP); Noboru Ooike, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days. days.

(21) Appl. No.: 15/410,470

(22) Filed: Jan. 19, 2017

(65) Prior Publication Data

US 2017/0337969 A1    Nov. 23, 2017

(30) Foreign Application Priority Data

May 20, 2016  (JP) .................................. 2016-101093

(51) Int. Cl.

| | |
|---|---|
| G11C 16/34 | (2006.01) |
| G11C 16/10 | (2006.01) |
| G11C 11/56 | (2006.01) |
| G06F 11/10 | (2006.01) |
| G11C 29/52 | (2006.01) |
| G11C 16/04 | (2006.01) |
| G11C 16/32 | (2006.01) |

(52) U.S. Cl.
CPC .......... *G11C 16/10* (2013.01); *G11C 11/5628* (2013.01); *G11C 16/3459* (2013.01); *G06F 11/1068* (2013.01); *G11C 16/0483* (2013.01); *G11C 16/32* (2013.01); *G11C 16/3454* (2013.01); *G11C 29/52* (2013.01); *G11C 2211/5621* (2013.01); *G11C 2211/5642* (2013.01)

(58) Field of Classification Search
CPC ............ G11C 16/3454; G11C 16/3459; G11C 11/5628
USPC .................................................... 365/185.22
See application file for complete search history.

(56) References Cited

U.S. PATENT DOCUMENTS

| 7,852,675 B2 | 12/2010 | Maejima |
|---|---|---|
| 8,009,470 B2 | 8/2011 | Iwai et al. |

(Continued)

FOREIGN PATENT DOCUMENTS

| JP | 2010287298 A | 12/2010 |
|---|---|---|
| JP | 2011076678 A | 4/2011 |
| JP | 2014241180 A | 12/2014 |

*Primary Examiner* — Jason Lappas
(74) *Attorney, Agent, or Firm* — Patterson & Sheridan, LLP

(57) ABSTRACT

A semiconductor memory device includes a plurality of memory cells, a plurality of word lines, including a word line that is connected to a group of the memory cells, and a control circuit configured to execute a write operation on the memory cells of the group. The write operation includes multiple program loops including a first program loop and a second program loop that is executed at a later time than the first program loop, and for each subsequent program loop, a program voltage that is applied to the first word line is increased from that of a current program loop. The program voltage is increased by a first amount from that of the current program loop if the next program loop is the first program loop and by a second amount that is less than the first amount if the next program loop is the second program loop.

18 Claims, 27 Drawing Sheets

(56) References Cited

U.S. PATENT DOCUMENTS

| | | |
|---|---|---|
| 8,233,323 B2 | 7/2012 | Hishida et al. |
| 8,372,720 B2 | 2/2013 | Fukuzumi et al. |
| 8,514,627 B2 | 8/2013 | Itagaki et al. |
| 8,559,226 B2 | 10/2013 | Abe et al. |
| 8,952,426 B2 | 2/2015 | Maejima |
| 9,070,445 B2 | 6/2015 | Yasuda et al. |
| 9,384,848 B2 | 7/2016 | Iwai et al. |
| 2011/0075489 A1 | 3/2011 | Yamane et al. |
| 2011/0082978 A1 | 4/2011 | Tomita |
| 2011/0273935 A1* | 11/2011 | Dong ................. G11C 11/5642 365/185.22 |
| 2011/0284946 A1 | 11/2011 | Kiyotoshi |

* cited by examiner

| | Command | Case1 | Case2 | Case3 | Case4 | Case5 |
|---|---|---|---|---|---|---|
| 1st program operation | 80h | Normal program | Normal program | Normal program | Special program (1st embodiment) | Special program (2nd embodiment) |
| 2nd program operation | xxh + 80h | Special program (1st embodiment) | Special program (2nd embodiment) | Special program (3rd embodiment) | Special program (3rd embodiment) | Special program (3rd embodiment) |

SEMICONDUCTOR MEMORY DEVICE AND MEMORY SYSTEM

CROSS-REFERENCE TO RELATED APPLICATION

This application is based upon and claims the benefit of priority from. Japanese Patent Application No. 2016-101093, filed May 20, 2016, the entire contents of which are incorporated herein by reference.

FIELD

Embodiments described herein relate generally to a semiconductor memory device and a memory system.

BACKGROUND

There are known semiconductor memory devices having memory cells that can store data of 2 bits or more.

DETAILED DESCRIPTION

Figure 1:
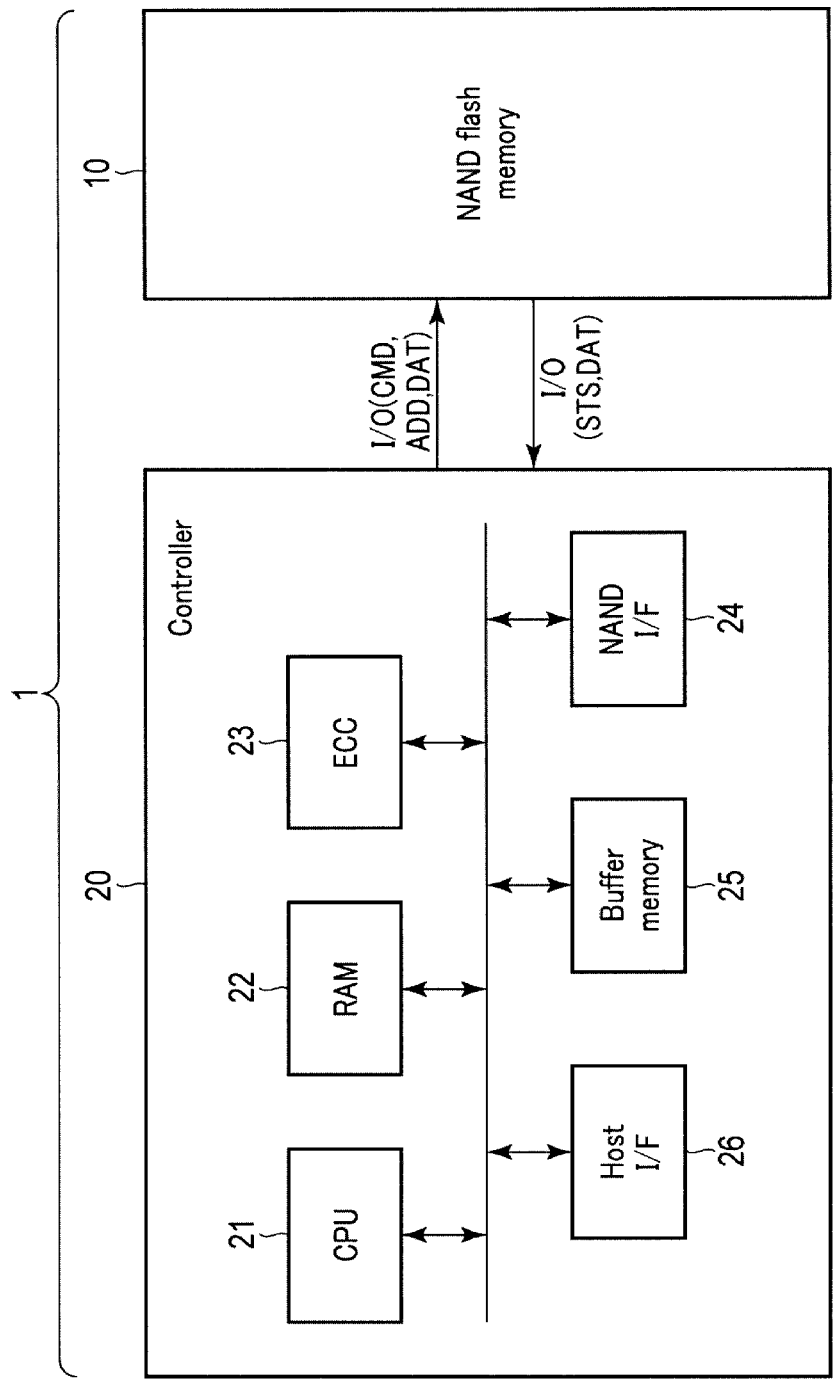
FIG. 1 is a block diagram illustrating a memory system according to a first embodiment.

According to an embodiment, a semiconductor memory device and a memory system capable of improving reliability of data are provided.

According to an embodiment, a semiconductor memory device includes a plurality of memory cells, a plurality of word lines, including a first word line that is connected to a group of the memory cells and other word lines connected to the memory cells that are not in the group, and a control circuit configured to execute a write operation on the memory cells of the group. The write operation includes multiple program loops including a first program loop and a second program loop that is executed at a later time than the first program loop, and for each subsequent program loop, a program voltage that is applied to the first word line is increased from that of a current program loop. The program voltage is increased by a first amount from that of the current program loop if the next program loop is the first program loop and by a second amount that is less than the first amount if the next program loop is the second program loop.

Hereinafter, embodiments will be described with reference to the drawings, where are schematic. In the following description, common reference numerals are given to elements having the same function and configuration. Some reference numerals employ alphabet letters as a suffix so that elements having the same configuration can be distinguished from one another. When it is not necessary to distinguish between such elements, such elements are referred to by the reference numerals without the suffix.

[1] First Embodiment

Hereinafter, a semiconductor memory device according to a first embodiment will be described.

[1-1] Configuration of Memory System 1

First, the configuration of a memory system will be described with reference to FIG. 1. FIG. 1 is a block diagram illustrating the memory system. As illustrated in FIG. 1, a memory system 1 includes a semiconductor memory device 10 and a controller 20.

The semiconductor memory device 10 is a NAND flash memory that stores data in a nonvolatile manner. The details of the configuration of the semiconductor memory device 10 will be described below.

The controller 20 commands the semiconductor memory device 10 to execute reading, writing, erasing, or the like in response to a command from an external host apparatus (not illustrated). The controller 20 manages a memory space of the semiconductor memory device 10.

As illustrated in FIG. 1, the controller 20 includes a processor (CPU) 21, an internal memory (RAM) 22, an ECC circuit 23, a NAND interface circuit 24, a buffer memory 25, and a host interface circuit 26.

The processor 21 controls an operation of the entire controller 20. For example, the processor 21 issues a writing command through the NAND interface in response to a writing command received from the host apparatus. This operation also applies to the read operation and the erasing operation.

The internal memory 22 is, for example, a semiconductor memory such as a DRAM and is used as a work area of the processor 21. The internal memory 22 retains firmware, various management tables, and the like for managing the semiconductor memory device 10.

The ECC circuit 23 executes error checking and correcting (ECC) on data. Specifically, the ECC circuit 23 generates a parity based on write data at the time of writing of data. The ECC circuit 23 generates a syndrome from the parity, detects an error, and corrects the detected error at the time of reading of data.

The NAND interface circuit 24 is connected to the semiconductor memory device 10 and governs communication with the semiconductor memory device 10. For example, the NAND interface circuit 24 transmits and receives input and output signals I/O to and from the semiconductor memory device 10. For example, the input and output signals I/O transmitted to the semiconductor memory device 10 by the controller 20 include a command CMD, address information ADD, and write data DAT. The input and output signals I/O received from the semiconductor memory device 10 by the controller 20 include status information STS and read data DAT.

The buffer memory 25 temporarily retains data received from the semiconductor memory device 10 and the host apparatuses by the controller 20.

The host interface circuit 26 is connected to the host apparatus via a host bus (not illustrated) and governs communication with the host apparatus. For example, the host interface circuit 26 transmits a command and data received from the host apparatus to the processor 21 and the buffer memory 25, respectively.

[1-1-1] Configuration of Semiconductor Memory Device 10

Figure 2:
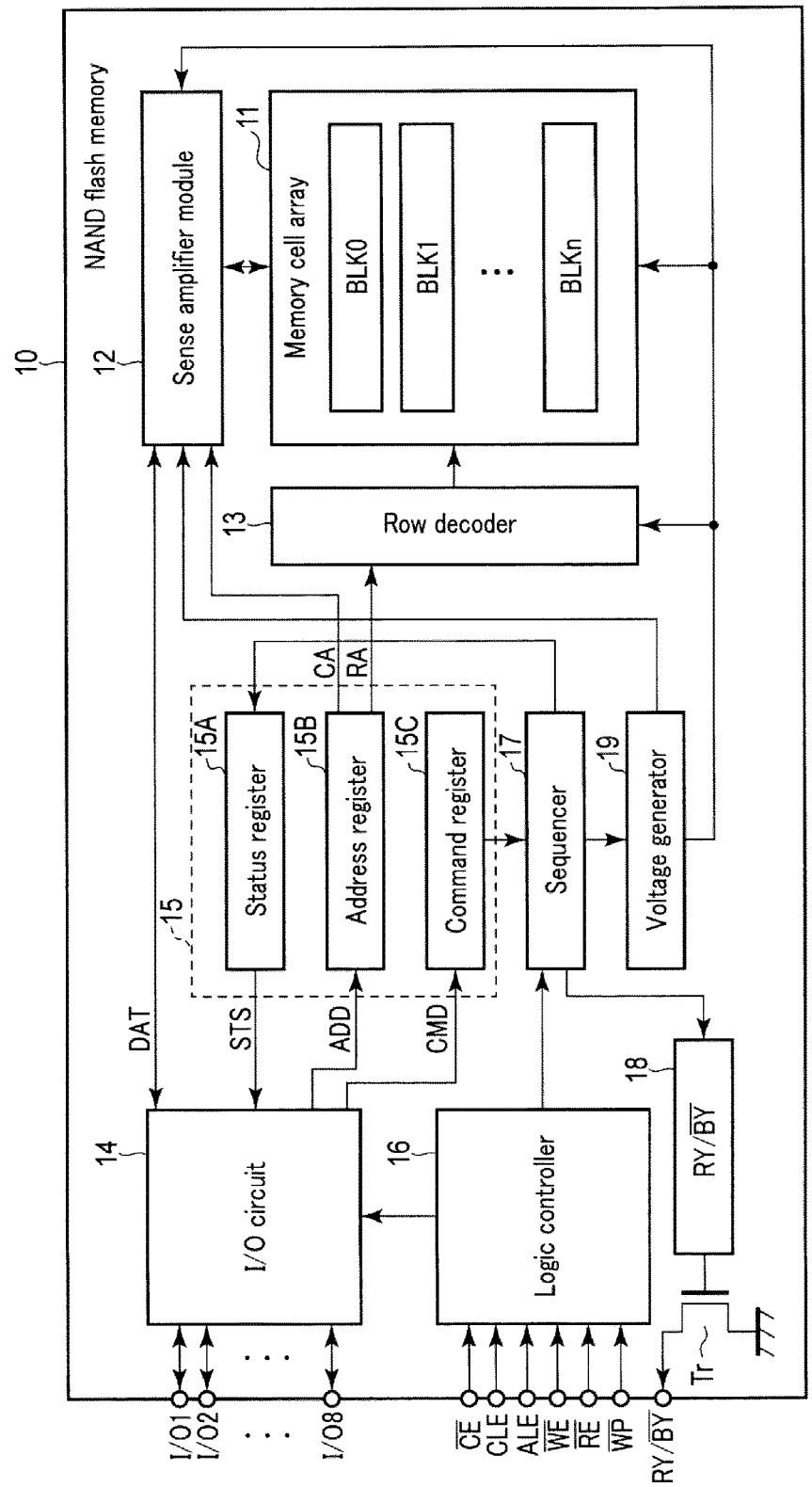
FIG. 2 is a block diagram illustrating a semiconductor memory device according to the first embodiment.

Next, the configuration of the semiconductor memory device 10 will be described with reference to FIG. 2. FIG. 2 is a block diagram illustrating the semiconductor memory device 10. As illustrated in FIG. 2, the semiconductor memory device 10 includes a memory cell array 11, a sense amplifier module 12, a row decoder 13, an input and output circuit 14, a register 15, a logic control circuit 16, a sequencer 17, a ready/busy control circuit 18, and a voltage generation circuit 19.

The memory cell array 11 includes blocks BLK0 to BLKn (where n is a natural number equal to or greater than 1). The blocks BLK are a set of a plurality of nonvolatile memory cells associated with bit lines and word lines and are, for example, units of data erasure. The semiconductor memory device 10 can retain data by applying a multi-level cell (MLC) scheme of storing data of 2 bits or more in each memory cell. In the present embodiment, a case in which the data of 2 bits is stored in the memory cell will be described as an example.

The sense amplifier module 12 outputs the data DAT read from the memory cell array 11 to the controller 20 via the input and output circuit 14. The sense amplifier module 12 transmits the write data DAT received from the controller 20 via the input and output circuit 14 to the memory cell array 11.

The row decoder 13 selects a word line corresponding to target memory cells executing a read operation and a write operation. The row decoder 13 applies desired voltages to the selected word lines and unselected word lines.

The input and output circuit 14 transmits and receives input and output signals I/O (I/O1 to I/O8) with 8-bit width to and from the controller 20. For example, the input and output circuit 14 transmits the write data DAT included in the input and output signal I/O received from the controller 20 to the sense amplifier module 12. The input and output circuit 14 transmits the read data DAT transmitted from the sense amplifier module 12 as the input and output signal I/O to the controller 20.

The register 15 includes a status register 15A, an address register 15B, and a command register 15C. The status register 15A retains status information STS. The status register 15A transmits the status information STS to the input and output circuit 14 in response to an instruction of the sequencer 17. The address register 15B receives the address information ADD from the input and output circuit 14 and retains the address information ADD. The address register 15B transmits a column address signal CA and a row address signal RA included in the address information ADD to the sense amplifier module 12 and the row decoder 13, respectively. The command register 15C receives the command CMD from the input and output circuit 14 and retains the command CMD. The command register 15C transmits the command CMD to the sequencer 17.

The logic control circuit 16 receives various control signals from the controller 20 and controls the input and output circuit 14 and the sequencer 17. The control signals are, for example, a chip enable signal /CE, a command latch enable signal CLE, an address latch enable signal ALE, a writing enable signal /WE, a reading enable signal /RE, and a writing protection signal /WP are used. The signal /CE enables the semiconductor memory device 10. The signal CLE is used to notify the input and output circuit 14 that a signal input to the semiconductor memory device 10 is the command CMD in tandem with the asserted signal CLE. The signal ALE is used to notify the input and output circuit 14 that a signal input to the semiconductor memory device 10 is the address information ADD in tandem with the asserted signal ALE. The signals /WE and /RE are, for example, used to instruct the input and output circuit 14 to input and output the input and output signals I/O1 to I/O8. The signal /WP is, for example, used to enter a protection state of the semiconductor memory device 10 at the time of turning on and off power.

The sequencer 17 controls an operation of the entire semiconductor memory device 10. Specifically, the sequencer 17 controls the sense amplifier module 12, the row decoder 13, the voltage generation circuit 19, and the like based on the command CMD transmitted from the command register 15C to execute a write operation, a read operation, and the like on the data. The sequencer 17 includes a counter. The counter is used at the time of the write operation and counts the number of times a program loop to be described below is repeated.

The ready/busy control circuit 18 generates a ready/busy signal RY/(/BY) based on an operation state of the sequencer and transmits the ready/busy signal RY/(/BY) to the controller 20. The ready/busy signal RY/(/BY) is used to notify the controller 20 whether the semiconductor memory device 10 is in a ready state (which is a state where the device is ready to receive a command from the controller 20) or a busy state (which is a state where the device is not ready to receive a command from the controller 20). The ready/busy signal RY/(/BY) is generated when the ready/busy control circuit 18 controls ON and OFF of a transistor Tr connected to the output of the ready/busy control circuit 18. For example, ready/busy signal RY/(/BY) considers the semiconductor memory device 10 to be at an "L" level during an operation such as reading of data (the busy state) and considers the semiconductor memory device 10 to be at an "H" level when such an operation is completed (ready state).

The voltage generation circuit 19 generates a desired voltage based on an instruction of the sequencer 17. The voltage generation circuit 19 supplies the generated voltage to the memory cell array 11, the sense amplifier module 12, and the row decoder 13.

[1-1-2] Configuration of Memory Cell Array 11

Figure 3:
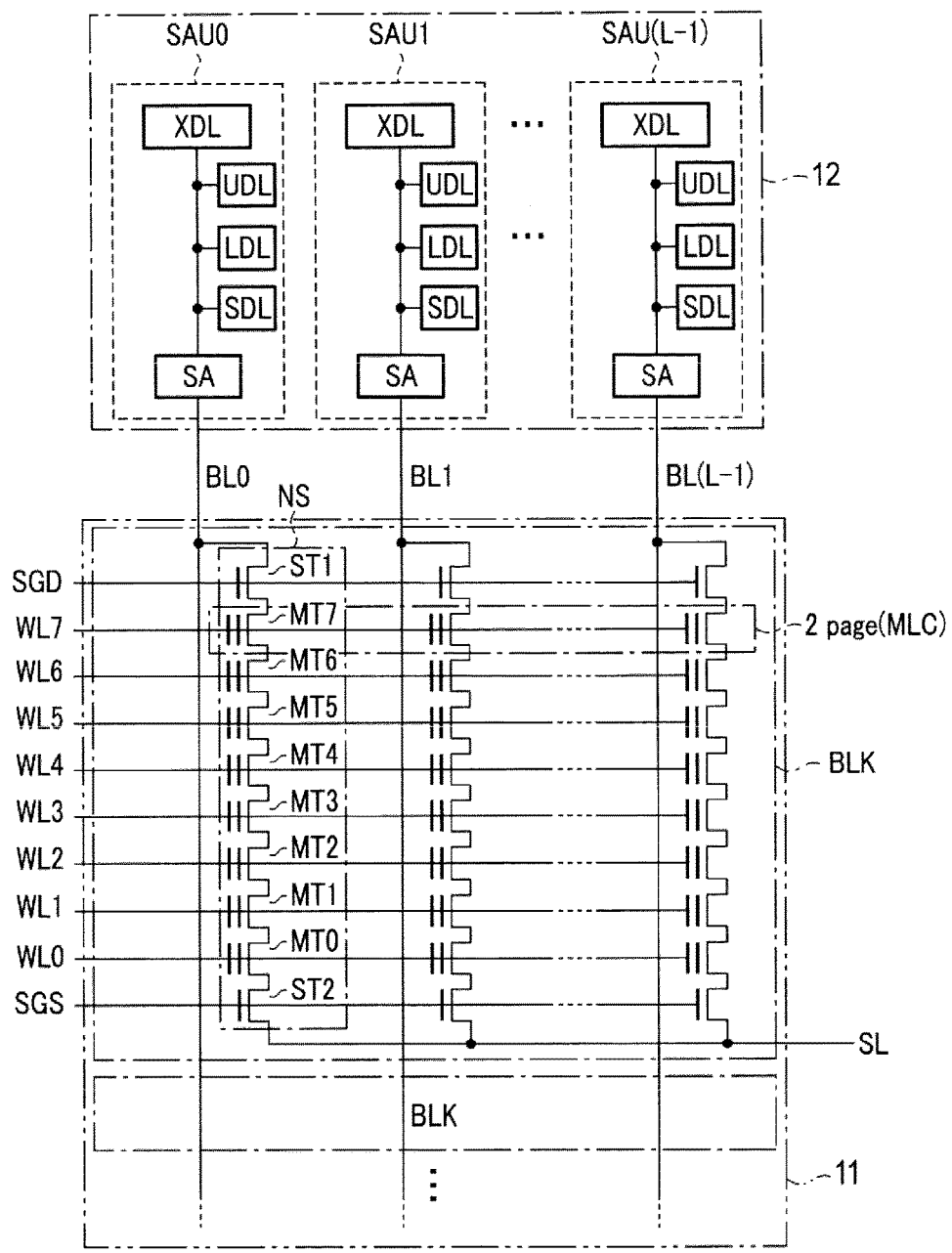
FIG. 3 is a circuit diagram illustrating a memory cell array and a sense amplifier module included in the semiconductor memory device according to the first embodiment.

Next, the configuration of the memory cell array 11 will be described with reference to FIG. 3. FIG. 3 is a circuit diagram illustrating the memory cell array 11 and the sense amplifier module 12. FIG. 3 illustrates the detailed circuit configuration of one block BLK in the memory cell array 11. As illustrated in FIG. 3, the block BLK includes a plurality of NAND strings NS.

The NAND strings NS are provided to correspond to the bit lines BL0 to BL (L−1) (where (L−1) is a natural number equal to or greater than 1) and include, for example, 8 memory cell transistors MT (MT0 to MT7) and select transistors ST1 and ST2. The number of memory cell transistors MT included in one NAND string NS is not limited thereto, but any number can be used.

The memory cell transistors MT include control gates and charge storage layers and retain data in a nonvolatile manner. The memory cell transistors MT0 to MT7 are connected in series between the source of the select transistor ST1 and the drain of the select transistor ST2. The gates of the select transistors ST1 and ST2 in the same block BLK are connected commonly to select gate lines SGD and SGS, respectively. Similarly, control gates of the memory cell transistors MT0 to MT7 in the same block BLK are connected commonly to word lines WL0 to WL7, respectively.

In the memory cell array 11, the drains of the select transistors ST1 in the NAND strings NS in the same column are connected commonly to the bit line BL. That is, the bit line BL commonly connect the NAND strings NS in the same column across a plurality of blocks BLK. Further, the sources of the plurality of select transistors ST2 are connected commonly to a source line SL.

In the foregoing configuration, a set of 1-bit data retained in the plurality of memory cells connected to the common word line WL is referred to as a "page". Accordingly, when 2-bit data is stored in one memory cell, data corresponding to 2 pages is stored in a set of the plurality of memory cells connected to one word line WL.

The write operation of data in the present embodiment is executed for each word line WL. For example, when 2-bit data is stored in one memory cell, data corresponding to 2 pages allocated to one word line WL is written together by inputting a command to instruct execution of the write operation. Hereinafter, a scheme of writing data for each word line WL is referred to as sequential writing.

The detailed configuration of the sense amplifier module 12 illustrated in FIG. 3 will be described below.

Figure 4:
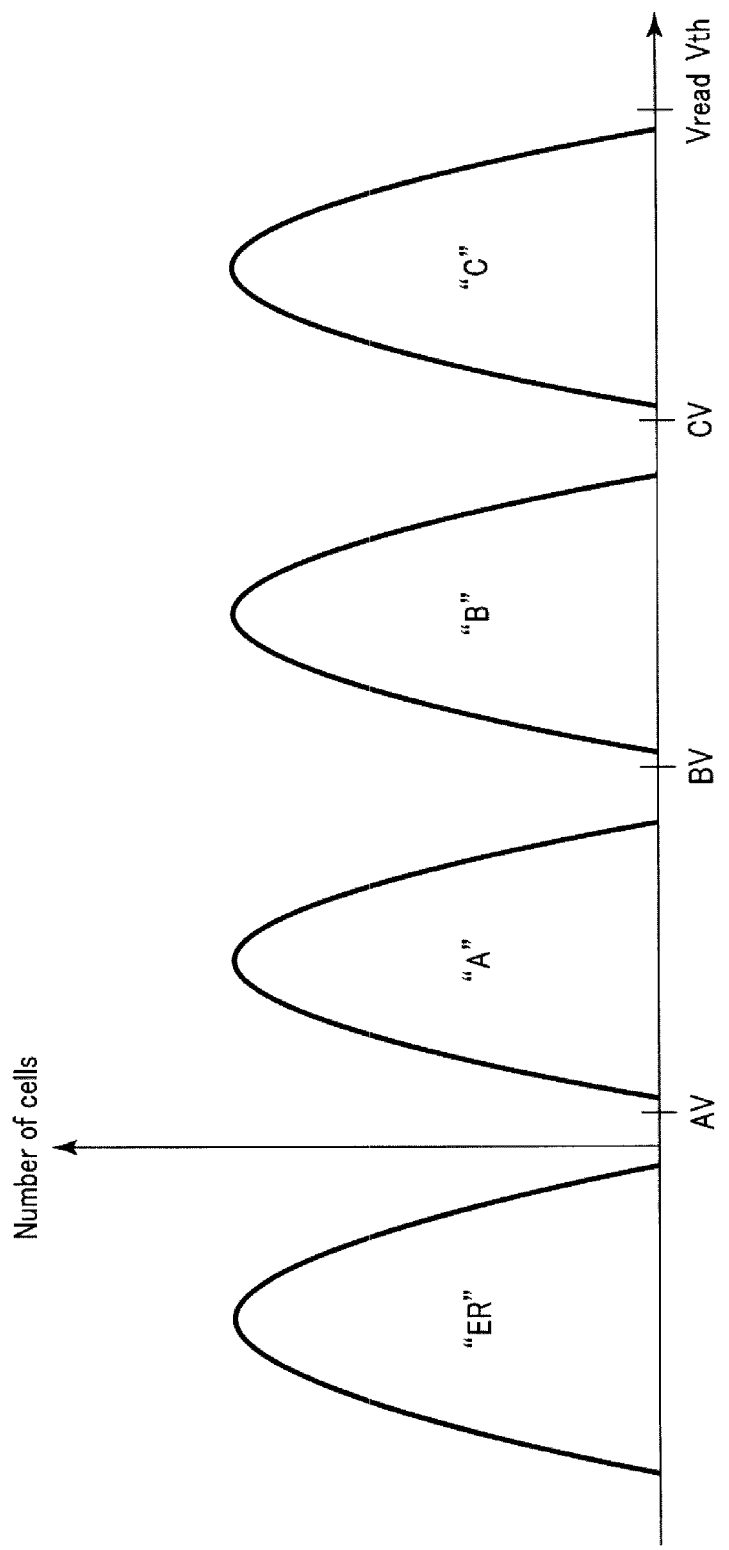
FIG. 4 is a diagram illustrating a threshold voltage distribution of the memory cell included in the semiconductor memory device according to the first embodiment.

A threshold voltage distribution of the memory cell transistors MT described above is illustrated in, for example, FIG. 4. FIG. 4 illustrates the threshold voltage distribution of the memory cell transistors MT retaining 2-bit data and voltages used at the time of verifying. The vertical axis and the horizontal axis in FIG. 4 represent the number of memory cell transistors MT and a threshold voltage Vth, respectively.

When the memory cell transistor MT retains 2-bit data, a distribution of the threshold voltage is divided into 4 threshold voltage distributions, as illustrated in FIG. 4. The pieces of 2-bit data corresponding to the 4 threshold voltage distributions are referred to as an "ER" level, an "A" level, a "B" level, and a "C" level in an ascending order of the threshold voltages. The verifying voltages AV, BV, and CV illustrated in FIG. 4 are used to verify the "A" level, the "B" level, and the "C" level at the time of the write operation, respectively. The reading voltage Vread is a voltage at which the memory cell transistor MT in which the reading voltage Vread is applied to the gate is turned on irrespective of retained data. A relation among the voltage values is AV<BV<CV<Vread.

A threshold voltage of the memory cell transistor MT retaining the "ER" level is lower than the voltage AV and corresponds to a data erasing state. A threshold voltage of the memory cell transistor MT retaining the "A" level is equal to or higher than the voltage AV and is lower than the voltage BV. A threshold voltage of the memory cell transistor MT retaining the "B" level is equal to or higher than the voltage BV and is lower than the voltage CV. A threshold voltage of the memory cell transistor MT retaining the "C" level is equal to or higher than the voltage CV.

At the time of the read operation, it is determined in which level the threshold voltage of the reading target memory cell transistor MT is included. For the sake of this determination, various reading voltages are determined. A voltage used to determine which memory cell transistor MT has the threshold voltage of the "ER" level or has a threshold voltage equal to or higher than the "A" level is set between the high edge of the "ER" level and the low edge of the "A" level. A voltage used to determine which memory cell transistor MT has a threshold voltage equal to or lower than the "A" level or has a threshold voltage equal to or higher than the "B" level is set between the high edge of the "A" level and the low edge of the "B" level. A voltage used to determine which memory cell transistor MT has a threshold voltage equal to or lower than the "B" level or has a threshold voltage of the "C" level is set between the high edge of the "B" level and the low edge of the "C" level.

[1-1-3] Configuration of Sense Amplifier Module 12

Next, referring back to FIG. 3, the configuration of the sense amplifier module 12 will be described. As illustrated in FIG. 3, the sense amplifier module 12 includes sense amplifier units SAU (SAU0 to SAU (L−1)) provided for the respective bit lines BL.

Each sense amplifier unit SAU includes a sense amplifier SA, latch circuits SDL, LDL, UDL, and XDL. The sense amplifier SA and the latch circuits SDL, LDL, UDL, and XDL are connected to be able to transmit and receive data between one another.

The sense amplifier SA senses data read in the corresponding bit line BL at the time of the read operation and determines whether the read data is "0" or "1". The sense amplifier SA applies a voltage to the bit line BL based on write data at the time of the write operation.

The latch circuits SDL, LDL, and UDL temporarily retain read data and write data. The read data confirmed by the sense amplifier SA at the time of the read operation and the write data transmitted to the latch circuit XDL at the time of the write operation are transmitted to any one of the latch circuits SDL, LDL, and UDL, for example.

The latch circuit XDL is used to input and output data between the sense amplifier unit SAU and the controller 20. That is, data received from the controller 20 is transmitted to the latch circuit SDL, LDL, or UDL or the sense amplifier SA via the latch circuit XDL. Further, data of the latch circuit SDL, LDL, or UDL or the sense amplifier SA is transmitted to the controller 20 via the latch circuit XDL.

Figure 5:
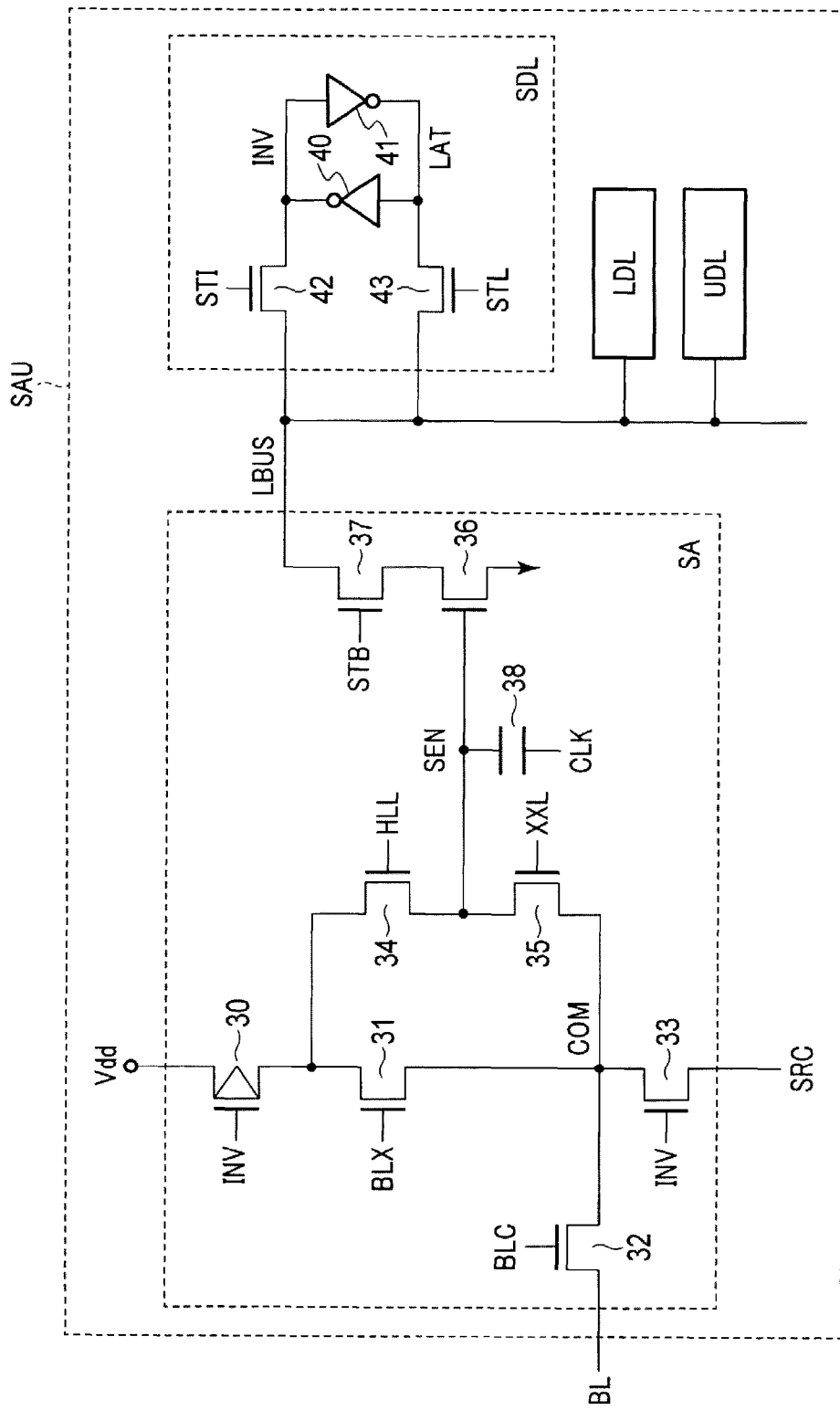
FIG. 5 is a circuit diagram illustrating the sense amplifier module included in the semiconductor memory device according to the first embodiment.

The circuit configuration of the sense amplifier unit SAU described above is illustrated in, for example, FIG. 5. FIG. 5 is a circuit diagram illustrating the sense amplifier unit SAU. FIG. 5 illustrates the detailed circuit configurations of the sense amplifier SA and the latch circuit SDL.

First, the circuit configuration of the sense amplifier SA will be described. As illustrated in FIG. 5, the sense amplifier SA includes a p-channel MOS transistor 30, n-channel MOS transistors 31 to 37, and a capacitor 38.

In the transistor 30, one end is connected to a power terminal and the gate is connected to a node INV. In the transistor 31, one end is connected to the other end of the transistor 30, the other end is connected to a node COM, and a control signal BLX is input to the gate. In the transistor 32, one end is connected to the node COM, the other end is connected to the corresponding bit line BL, and a control signal BLC is input to the gate. In the transistor 33, one end is connected to the node COM, the other end is connected to a node SRC, and the gate is connected to the node INV.

In the transistor 34, one end is connected to the other end of the transistor 30, the other end is connected to a node SEN, and a control signal HLL is input to the gate. In the transistor 35, one end is connected to the node SEN, the other end is connected to the node COM, and a control signal XXL is input to the gate. In the transistor 36, one end is connected to a ground terminal and the gate is connected to the node SEN. In the transistor 37, one end is connected to the other end of the transistor 36, the other end is connected to a bus LBUS, and a control signal STB is input to the gate. In the capacitor 38, one end is connected to the node SEN and a clock CLK is supplied to the other end.

A voltage to be applied to the power terminal connected to the one end of the transistor 30 is, for example, Vdd. A voltage to be applied to the node SRC is, for example, Vss.

Next, the circuit configuration of the latch circuit SDL will be described. As illustrated in FIG. 5, the latch circuit SDL includes inverters 40 and 41 and transistors 42 and 43.

In the inverter 40, an input terminal is connected to a node LAT and an output terminal is connected to the node INV. In the inverter 41, an input terminal is connected to the node INV and an output terminal is connected to the node LAT. In the transistor 42, one end is connected to the node INV, the other end is connected to the bus LBUS, and the control signal STI is input to the gate. In the transistor 43, one end is connected to the node LAT, the other end is connected to the bus LBUS, and the control signal STL is input to the gate.

The circuit configurations of the latch circuits LDL and UDL are the same as the above-described circuit configuration of the latch circuit SDL, and thus the description thereof will be omitted.

In the configuration of the sense amplifier unit SAU described above, various control signals are generated by, for example, the sequencer 17. In the read operation, a timing at which the read data is confirmed by the sense amplifier unit SAU is based on a timing at which the signal STB is asserted. In various operations, the transistor 32 clamps the voltage of the bit line BL based on the signal BLC.

The configuration of the sense amplifier module 12 is not limited thereto, but may be modified in various forms. For example, the number of latch circuits included in the sense amplifier unit SAU is designed based on the number of bits of the data retained by one memory cell transistor MT.

For example, the configuration disclosed in U.S. patent application Ser. No. 13/052,148, filed on Mar. 21, 2011, titled "THRESHOLD DETECTING METHOD AND VERIFY METHOD OF MEMORY CELL" can be applied as the configuration of the sense amplifier module 12. The entire contents of this patent application are incorporated by reference in the present specification.

[1-2] Write Operation

Next, an overview of the write operation in the semiconductor memory device 10 will be described. In the write operation, a program loop which is a combination of a program operation, a verifying operation, and a detection operation is repeated.

In the program operation, by applying a program voltage to the word line WL, electrons are injected into a charge storage layer of the memory cell transistor MT, and thus the threshold voltage of the memory cell transistor MT increases. For the writing-completed and writing-inhibited memory cell transistors MT, for example, a variation in the threshold voltage is suppressed by a self-boost technology or the like. The writing-completed and writing-inhibited memory cell transistors MT are the memory cell transistors MT in which the threshold voltage has reached a desired threshold voltage in the write operation.

In the program operation, the program voltage to be applied to the word line WL is stepped up for each program loop. That is, the program voltage is increased by a given amount for each program loop. Further, in the write operation according to the present embodiment, the amount the program voltage increased at each subsequent program loop is made smaller when a verifying operation of a particular level, e.g., A level, results in a pass.

In the verifying operation, it is confirmed whether the threshold voltage varied in the program operation reaches an appropriate level. When a pass results in the verifying, the verifying of that level is not executed in the subsequent verifying operation. A verifying level in the verifying operation is set based on, for example, the number of program cycles. For example, in the first program loop, the verifying is executed at the "A" level and the "B" level at which a threshold value is low.

In the detection operation, for example, the sequencer 17 determines whether the pass results in the verifying of each level from a result of the verifying operation. Specifically, when the number of memory cells for which the write operation ends for each writing level is less than a predetermined number, the sequencer 17 determines that a fail results in the verifying of that level. When the number of memory cells is equal to or greater than the predetermined number, the sequencer 17 determines that the pass results in the verifying of that level.

Figure 6:
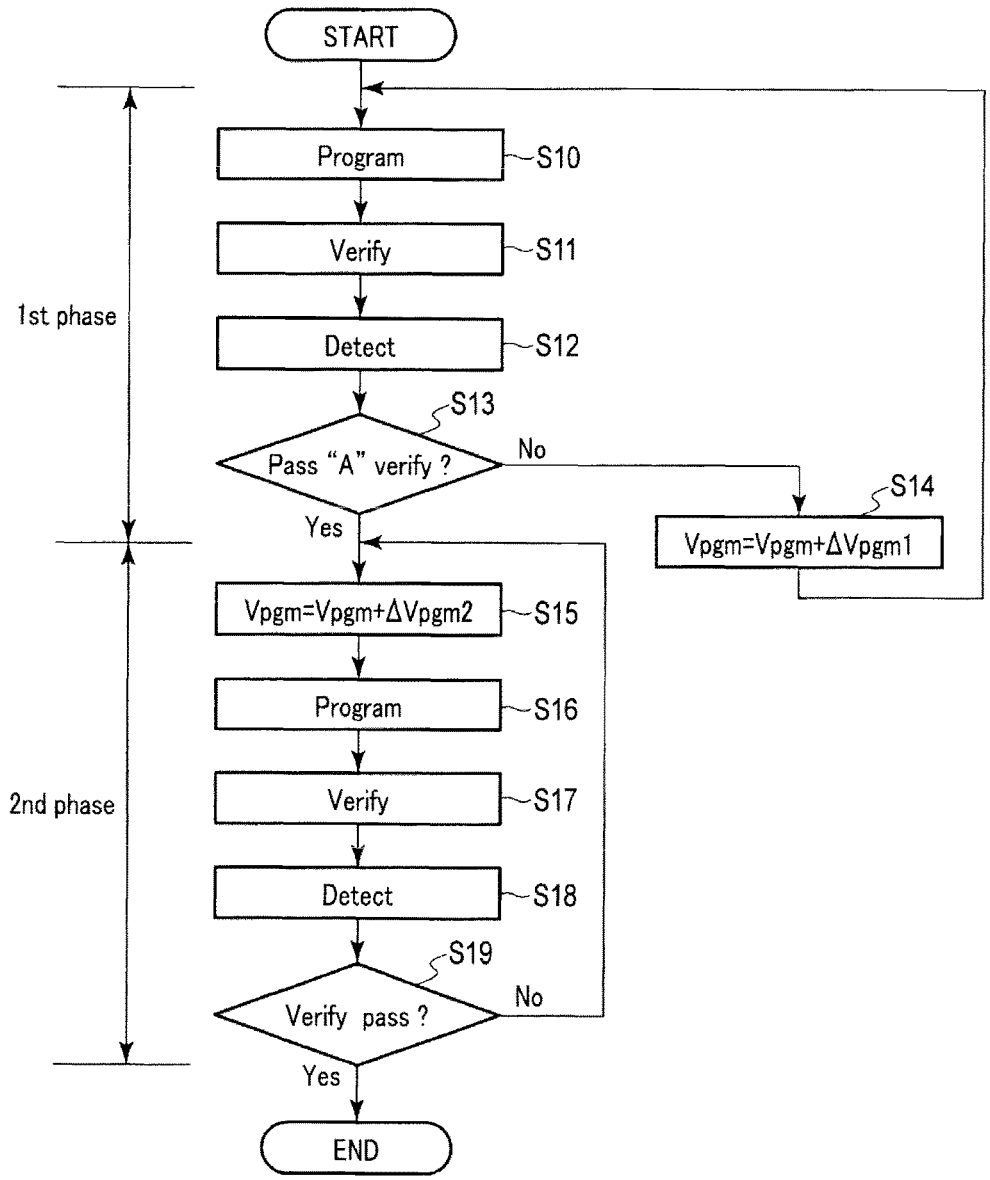
FIG. 6 is a flowchart illustrating a write operation in the semiconductor memory device according to the first embodiment.
Figure 7:
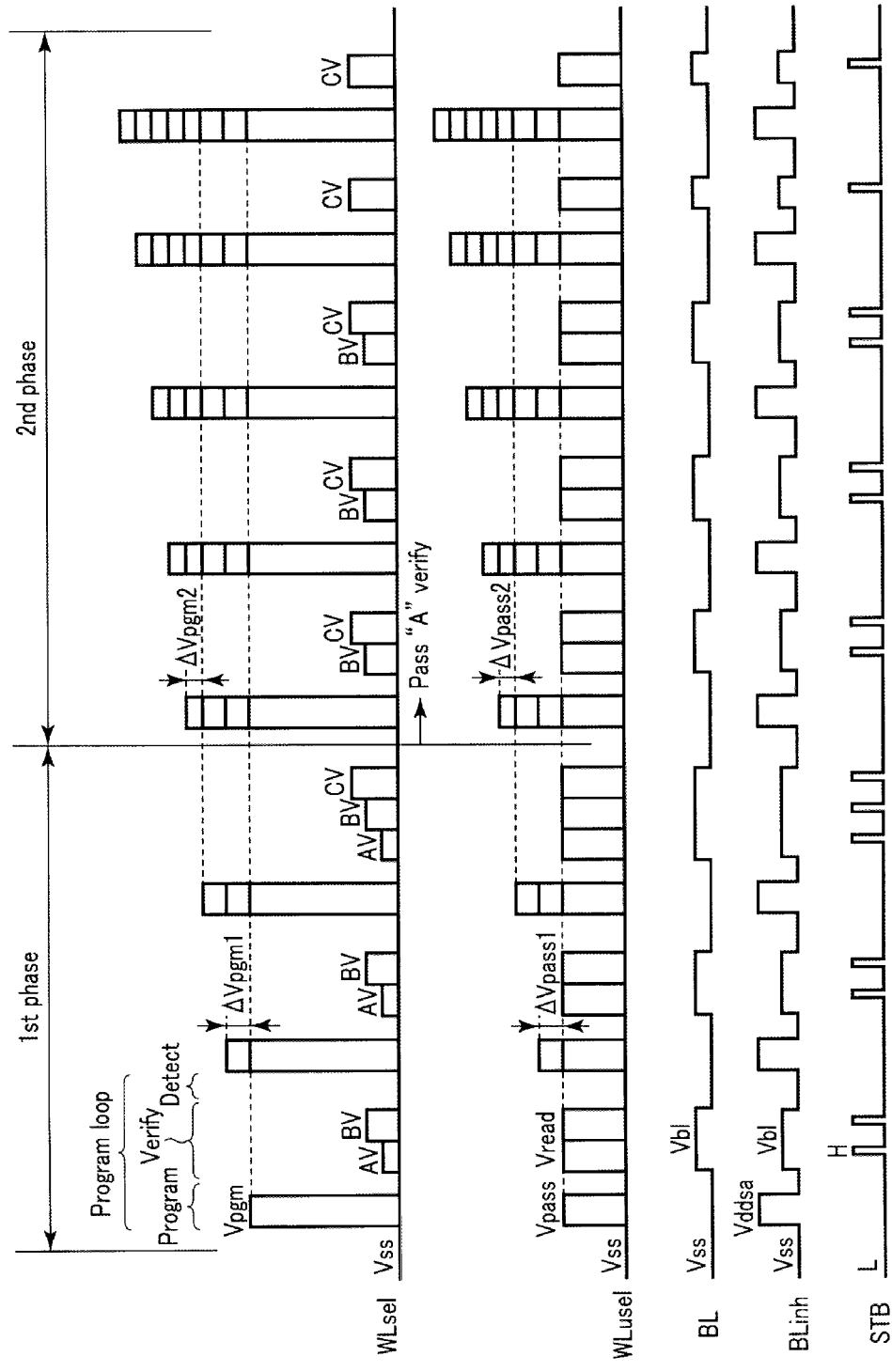
FIG. 7 is a diagram illustrating waveforms of the write operation in the semiconductor memory device according to the first embodiment.

Next, the details of the write operation of the semiconductor memory device 10 will be described with reference to FIGS. 6 and 7. FIG. 6 is a flowchart illustrating the write operation. FIG. 7 illustrates an example of the write operation as a timing chart.

As illustrated in FIG. 6, the write operation according to the present embodiment can be divided into two phases, each including program loops. The phases are referred to as first and second phases of the write operation in order of the execution of the phases. Operations of the phases will be described below.

In the following description, the word lines WL connected to a group of the write target memory cell transistors MT are referred to as selected word lines WLsel and the other word lines WL are referred to as unselected word lines WLusel. The bit lines BL connected to the NAND strings NS including the memory cell transistors MT for which the threshold voltage is desired to be increased through the write operation are referred to as write target bit lines BL. The bit lines BL connected to the NAND strings NS including the memory cell transistors MT for which a variation in the threshold voltage is desired to be suppressed through the write operation are referred to as write-inhibited bit lines BLinh.

First, the first phase of the write operation will be described.

The sequencer 17 first executes the program operation (step S10). Specifically, as illustrated in FIG. 7, the sense amplifier module 12 applies the voltage Vss to the write target bit lines BL and applies the voltage Vddsa to the write-inhibited bit lines BLinh. The voltage Vss is a ground voltage and the voltage Vddsa is a power voltage to be supplied from the sense amplifier module 12. When the voltage Vddsa is applied to the bit lines BLinh, the corresponding select transistors ST1 are not turned on and the channels of the memory cell transistors MT enter a floating state.

When the row decoder 13 applies a program voltage Vpgm to the selected word lines WLsel and applies a writing pass voltage Vpass to the unselected word lines WLusel. The voltage Vpgm is a high voltage at which electrons can be injected into the charge storage layer of the memory cell transistor MT and the initial value of the voltage Vpgm is higher than the voltage Vpass. The initial value of the voltage Vpass satisfies "Vread≥Vpass>Vss". Then, in the write target memory cell transistor MT, the threshold voltage is increased due to a potential difference between the control gate and the channel. Conversely, in the write-inhibited memory cell transistor MT, a variation in the threshold voltage is suppressed by boosting the voltage of the channel.

Next, the sequencer 17 executes the verifying operation (step S11). Specifically, as illustrated in FIG. 7, the sense amplifier module 12 applies a voltage Vbl to each bit line BL. The voltage Vbl is used for the sense amplifier module 12 to determine data stored in the memory cell transistor MT, and the value of the voltage Vbl satisfies "Vddsa>Vbl>Vss".

The row decoder 13 applies each verifying voltage to the selected word lines WLsel in order and applies the voltage Vread to the unselected word lines WLusel. At this time, the sequencer 17 asserts the signal STB when each verifying voltage is applied to the selected word lines WLsel. When the signal STB is asserted, the sense amplifier module 12 determines whether the threshold voltage of the write target memory cell transistor MT is equal to or higher than the verifying voltage.

Next, the sequencer 17 executes the detection operation (step S12). Subsequently, the sequencer 17 confirms a verifying result of the "A" level (step S13). Here, when the fail results in the verifying of the "A" level (No in step S13), the sequencer 17 increases the program voltage Vpgm by ΔVpgm1 (step S14) and the operation returns to step S10. The writing pass voltage Vpass in step S14 is also increased by ΔVpass1. ΔVpass1 is equal to or lower than ΔVpgm1.

In the first phase of the write operation described above, the program voltage Vpgm and the writing pass voltage Vpass is increased by ΔVpgm1 and ΔVpass1, respectively, and the program loop corresponding to steps S10 to S12 is repeated. Conversely, when the pass results in the verifying of the "A" level (Yes in step S13), the write operation in the semiconductor memory device 10 proceeds to the second phase. That is, in this example, the program loop in the first phase is repeated until the pass results in the verifying of the "A" level.

Next, the second phase of the write operation will be described. In the program loop of the second phase, the amount of the program voltage Vpgm increased for each program loop is considered to be less than in the first phase.

Specifically, the sequencer 17 increases the voltages Vpgm and Vpass by ΔVpgm2 and ΔVpass2 (step S15). ΔVpgm2 and ΔVpass2 are lower than ΔVpgm1 and ΔVpass1, respectively. Subsequently, the sequencer 17 executes the program operation, the verifying operation, and the detection operation in order (steps S16 to S18). The operation of the program loop corresponding to the steps S16 to S18 is the same as the operation of the program loop corresponding to steps S10 and S12.

Next, the sequencer 17 confirms whether the pass results in the verifying of the remaining levels (step S19). Here, when the fail results in the verifying (No in step S19), the operation returns to step S15.

In the second phase of the write operation described above, the program voltage Vpgm and the writing pass voltage Vpass are increased by ΔVpgm2 and ΔVpass2, the program loop corresponding to steps S16 to S18 is repeated. Then, when the pass results in the verifying of the remaining levels (Yes in step S19), the semiconductor memory device 10 ends the write operation.

Figure 8:
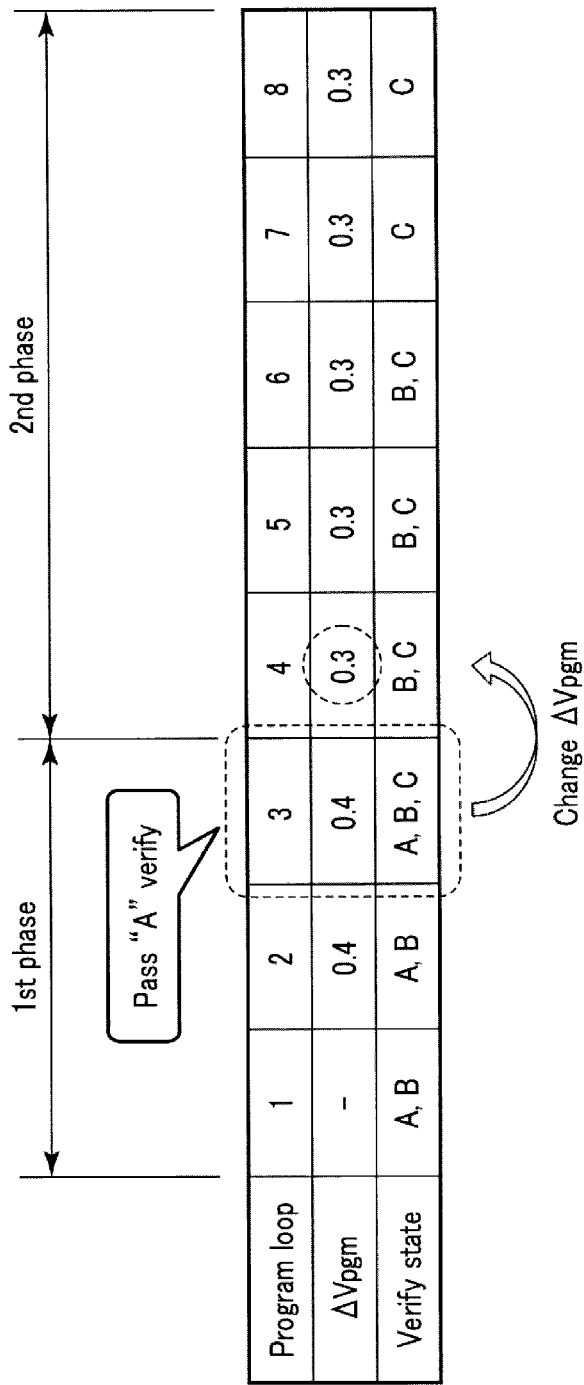
FIG. 8 is a diagram illustrating a write operation in the semiconductor memory device according to the first embodiment.

FIG. 8 illustrates the foregoing operation as a table of parameters corresponding to the example illustrated in FIG. 7. FIG. 8 illustrates the number of program loops, the increase amount ΔVpgm of the program voltage from the immediately previous program loop, and the level of the verifying executed in the program loop.

As illustrated in FIG. 8, in this example, the pass results in the verifying of the "A" level in the third program loop and ΔVpgm is changed in the fourth program loop. Specifically, while ΔVpgm is 0.4 V (ΔVpgm1) until the pass in the verifying of the "A" level, ΔVpgm is decreased to 0.3 V (ΔVpgm2) after the pass in the verifying of the "A" level.

That is, in this example, the first to third program loops correspond to the first phase of the write operation and the fourth to eighth program loops correspond to the second phase of the write operation.

In this way, in the write operation of the semiconductor memory device 10 according to the present embodiment, based on the pass in the verifying of the "A" level, $\Delta Vpgm$ is made smaller in subsequent program loops. In the present embodiment, for example, the pass in the verifying of the "A" level is used as a trigger to reduce $\Delta Vpgm$, as described. However, an embodiment is not limited thereto. For example, the pass in the verifying of the "B" level may be used as the trigger to reduce $\Delta Vpgm$.

[1-3] Advantages of First Embodiment

Next, the advantages of the first embodiment will be described. The semiconductor memory device 10 according to the present embodiment can improve reliability of the written data. The details of the advantages will be described below.

In the write operation of the semiconductor memory device, the threshold voltage of the memory cell is ideally increased by a double of the increase amount ($\Delta Vpgm$) of the program voltage for each program loop. However, generally, it is difficult to increase the threshold voltage of the memory cell when the threshold voltage of the memory cell has reached higher levels. Therefore, as to the memory cell in which the threshold voltage has reached higher levels, an increase in the threshold voltage with respect to $\Delta Vpgm$ (i.e., program slope) is deteriorated. The program slope at the time of writing on the memory cell in which the threshold voltage has reached high levels tends to be worse as $\Delta Vpgm$ is larger.

Figure 9:
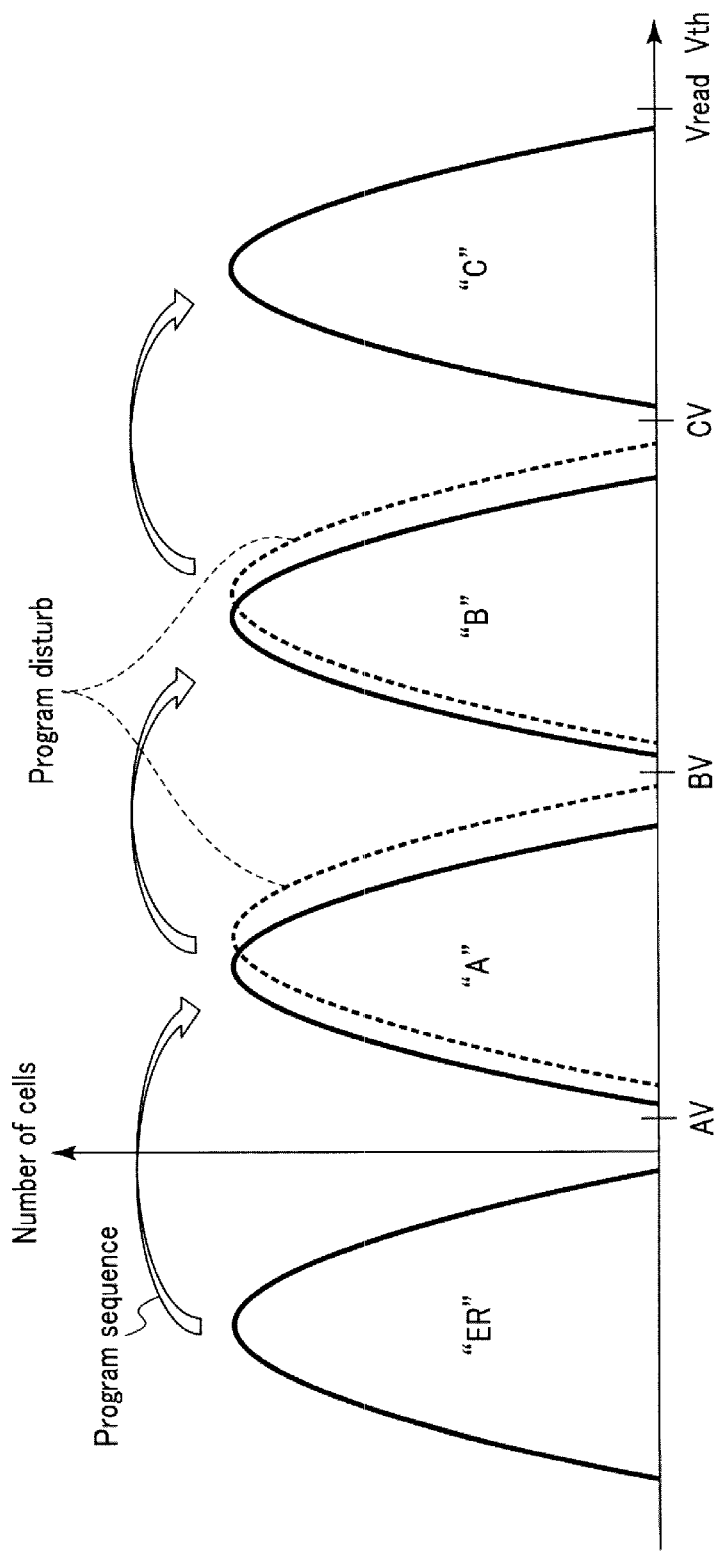
FIG. 9 is a diagram illustrating advantages in the semiconductor memory device according to the first embodiment.

Thus, even when the program voltage of large $\Delta Vpgm$ is applied to the memory cell for which the program slope has deteriorated, contribution to the increase in the threshold voltage is not large. When the program loop is repeated in the deterioration state of the program slope regardless of the increase in the threshold voltage, a gap between an increase amount of the threshold voltage and an increase amount of the program voltage increases, and thus the final program voltage increases. When an unnecessarily high program voltage is applied, an influence of a program disturbance on the memory cell in which the write operation has ended may increase. Specifically, as indicated dotted lines of a threshold voltage distribution diagram illustrated in FIG. 9, the threshold voltage distribution is shifted, and there is a possibility of an increase in the number of error bits in the read operation.

As a method of reducing the influence of the program disturbance, reducing $\Delta Vpgm$ for each program loop is considered. When $\Delta Vpgm$ is reduced for each program loop, the program slope at the time of writing of the memory cell for which the threshold voltage increases is improved. That is, since the gap between the increase amount of the threshold voltage and the increase amount of the program voltage decreases, it is possible to reduce the final program voltage. However, when $\Delta Vpgm$ is set to be small in the entire write operation, the number of program loops in the write operation increases. Therefore, the time of the write operation may be lengthened.

Accordingly, the semiconductor memory device 10 according to the present embodiment decreases the size of $\Delta Vpgm$ applied to each program loop from the middle of the write operation. Specifically, based on the end of the write operation at a predetermined level, $\Delta Vpgm$ is decreased for each program loop after the program loop in which the write operation ends at the predetermined level. Further, in other words, based on the pass in the verifying of the predetermined level, $\Delta Vpgm$ is changed to be smaller for each program loop after the program loop in which the pass results in the verifying of that level.

That is, in the first half of the write operation in which the threshold voltage of the memory cell is low and the second half of the write operation in which the threshold voltage of the memory cell is high, $\Delta Vpgm$ is changed for each program loop occurring in the second half of the write operation. Specifically, in the first half of the write operation in which the program slope is good irrespective of the magnitude of $\Delta Vpgm$, $\Delta Vpgm$ is set to be large for each program loop. In the second half of the write operation in which the program slope deteriorates when $\Delta Vpgm$ is large, $\Delta Vpgm$ is set to be small for each program loop so that the program slope is improved.

In this way, in the write operation of the semiconductor memory device 10 according to the present embodiment, it is possible to reduce the size of the final program voltage. Accordingly, the semiconductor memory device 10 according to the present embodiment can reduce the influence of the program disturbance, and thus can improve the reliability of the written data.

In the write operation of the semiconductor memory device 10 according to the present embodiment, it is possible to increase the increase amount of the threshold voltage for each program loop in the first half of the write operation by setting $\Delta Vpgm$ to be large for each program loop in the first half of the write operation. In this way, the semiconductor memory device 10 according to the present embodiment can suppress the number of program loops in the first half of the write operation, and thus can suppress a reduction in the speed of the write operation.

Because of the deterioration in the program slope, a large $\Delta Vpgm$ in the second half of the write operation in which the threshold voltage of the memory cell is high does not considerably contribute to the increase in the threshold voltage. That is, in the second half of the write operation, in some cases, there is no large difference in the increase amount of the threshold voltage between when small $\Delta Vpgm$ is set and when large $\Delta Vpgm$ is set. Accordingly, in the semiconductor memory device 10 according to the present embodiment, the increase in the number of program loops is suppressed even when small $\Delta Vpgm$ is set in the second half of the write operation. Therefore, it is possible to suppress the reduction in the speed of the write operation.

[2] Second Embodiment

Next, a semiconductor memory device according to a second embodiment will be described. A write operation of the second embodiment is different from the write operation described in the first embodiment in that the detection operation for each program loop and the program operation for the subsequent program loop executed in parallel. Hereinafter, differences from the first embodiment will be described.

[2-1] Write Operation

Figure 10:
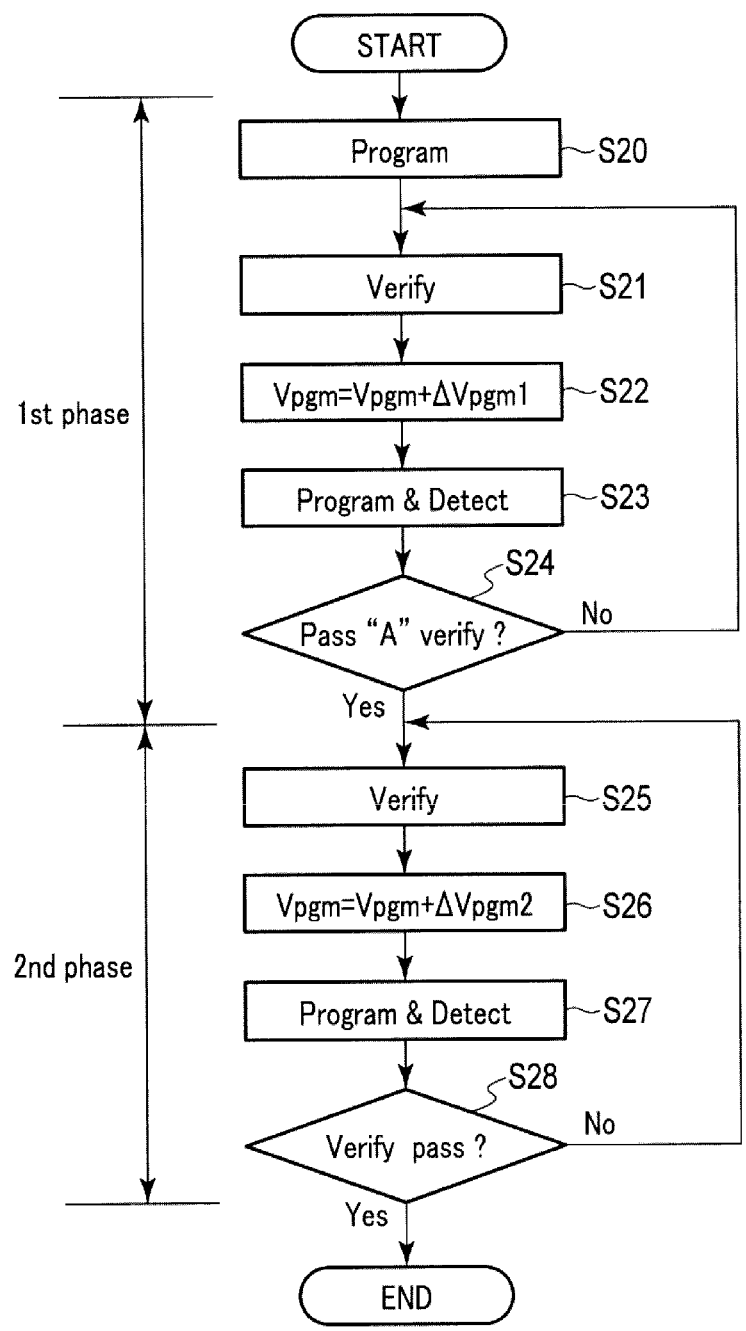
FIG. 10 is a flowchart illustrating a write operation in a semiconductor memory device according to a second embodiment.
Figure 11:
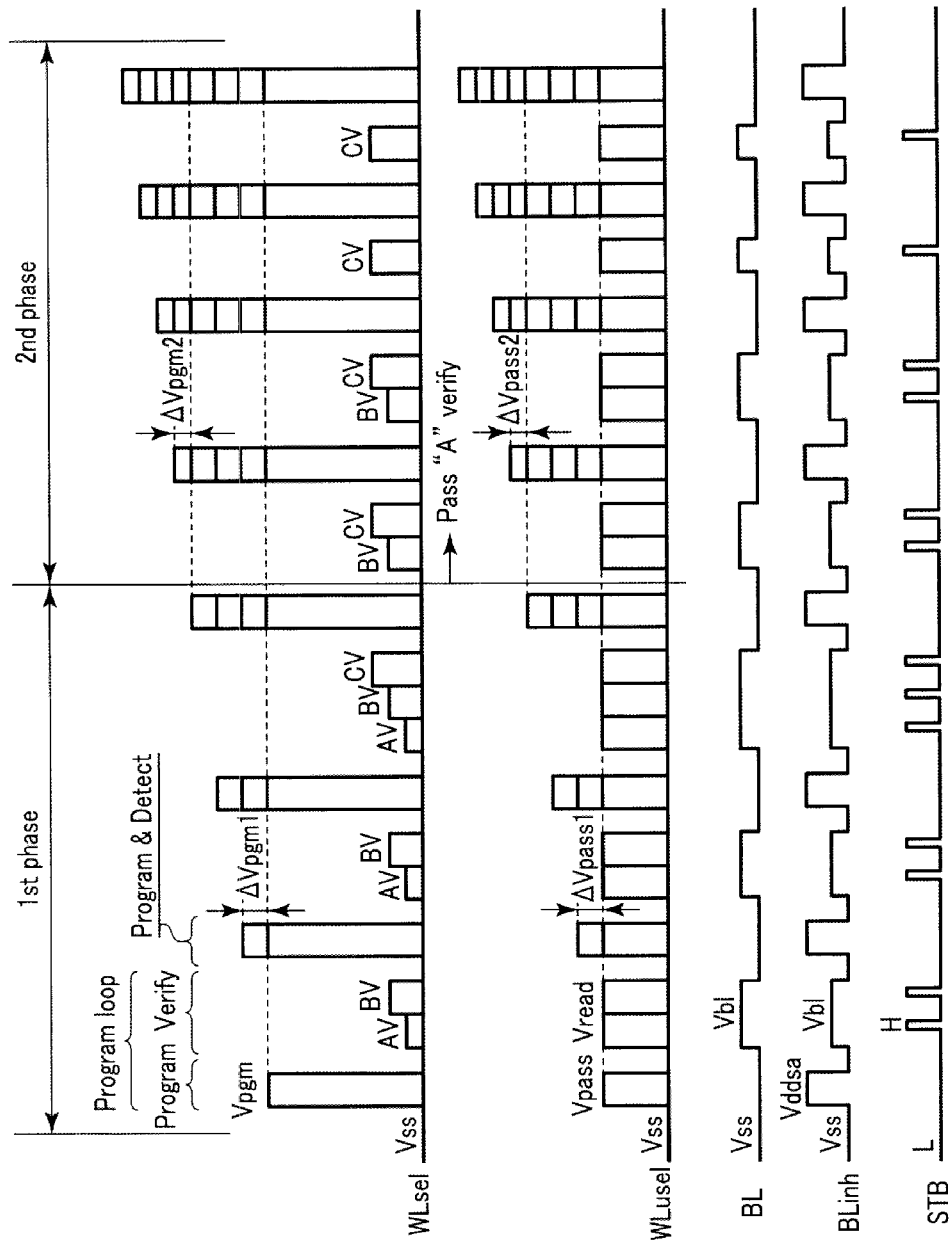
FIG. 11 is a diagram illustrating waveforms of the write operation in the semiconductor memory device according to the second embodiment.

First, a write operation of the semiconductor memory device 10 will be described with reference to FIGS. 10 and 11. FIG. 10 is a flowchart illustrating the write operation. FIG. 11 illustrates an example of the write operation as a timing chart.

As illustrated in FIG. 10, the write operation of the present embodiment can be divided into two phases including program loops, as in the first embodiment. Operations of the phases will be described below.

First, the first phase of the write operation will be described.

The sequencer 17 first executes the program operation (step S20). The specific operation illustrated in FIG. 11 is the same as step S10 described in the first embodiment. In this way, the threshold voltage of the write target memory cell transistor MT is varied, and thus the variation in the threshold voltage is suppressed in the writing-inhibited memory cell transistor MT.

Next, the sequencer 17 executes the verifying operation (step S21). The specific operation illustrated in FIG. 11 is the same as step S11 described in the first embodiment. In this way, it is determined whether the threshold voltage of the write target memory cell transistor MT is equal to or greater than the verifying voltage.

Next, the sequencer 17 increases the program voltage Vpgm by ΔVpgm1 (step S22). In step S22, the writing pass voltage Vpass is also increased by ΔVpass1.

Next, the sequencer 17 executes the program operation and the detection operation (step S23). Specifically, after the same program operation as step S20 is executed, the detection operation on the verifying result obtained in step S21 is executed. That is, the detection operation on each verifying operation and the program operation continuing after the detection operation are executed in parallel.

Next, the sequencer 17 confirms the verifying result of the "A" level (step S24). Here, when the fail results in the verifying of the "A" level (No in step S24), the sequencer 17 returns to the operation of step S21.

In the first phase of the write operation described above, the program voltage Vpgm and the writing pass voltage Vpass is increased by ΔVpgm1 and ΔVpass1, respectively, and the program loop corresponding to steps S21 to S23 is repeated. Conversely, when the pass results in the verifying of the "A" level (Yes in step S24), the write operation in the semiconductor memory device 10 proceeds to the second phase. That is, in this example, the program loop in the first phase is repeated until the pass results in the verifying of the "A" level.

Next, the second phase of the write operation will be described. In the program loop of the second phase, as in the first embodiment, the amount of the program voltage Vpgm increased for each program loop is made smaller than in the first phase.

Specifically, the same verifying operation as step S21 is executed (step S25). Next, the sequencer 17 increases the program voltages Vpgm and the writing pass voltage Vpass by ΔVpgm2 and ΔVpass2 (step S26). ΔVpgm2 and ΔVpass2 are lower than ΔVpgm1 and ΔVpass1, respectively.

Next, the sequencer 17 executes the same program operation and detection operation as step S23 (step S27). Subsequently, the sequencer 17 confirms whether the pass results in the verifying of the remaining levels (step S28). Here, when the fail results in the verifying (No in step S28), the operation returns to step S25.

In the second phase of the write operation described above, the program voltage Vpgm and the writing pass voltage Vpass are increased by ΔVpgm2 and ΔVpass2, the program loop corresponding to steps S25 to S27 is repeated. Then, when the verifying of the remaining levels results in a pass (Yes in step S28), the semiconductor memory device 10 ends the write operation.

In the write operation of the present embodiment, the detection operation after the verifying operation is executed in parallel to the subsequent program operation. Therefore, an interval at which the verifying operation proceeds to the subsequent program operation is shorter than in the first embodiment. Since the verifying operation and the program operation are executed in parallel, the verifying result of each level is not considered until the subsequent program loop in some cases. That is, as illustrated in FIG. 11, after the program voltage is applied, the write operation ends in some cases.

Figure 12:
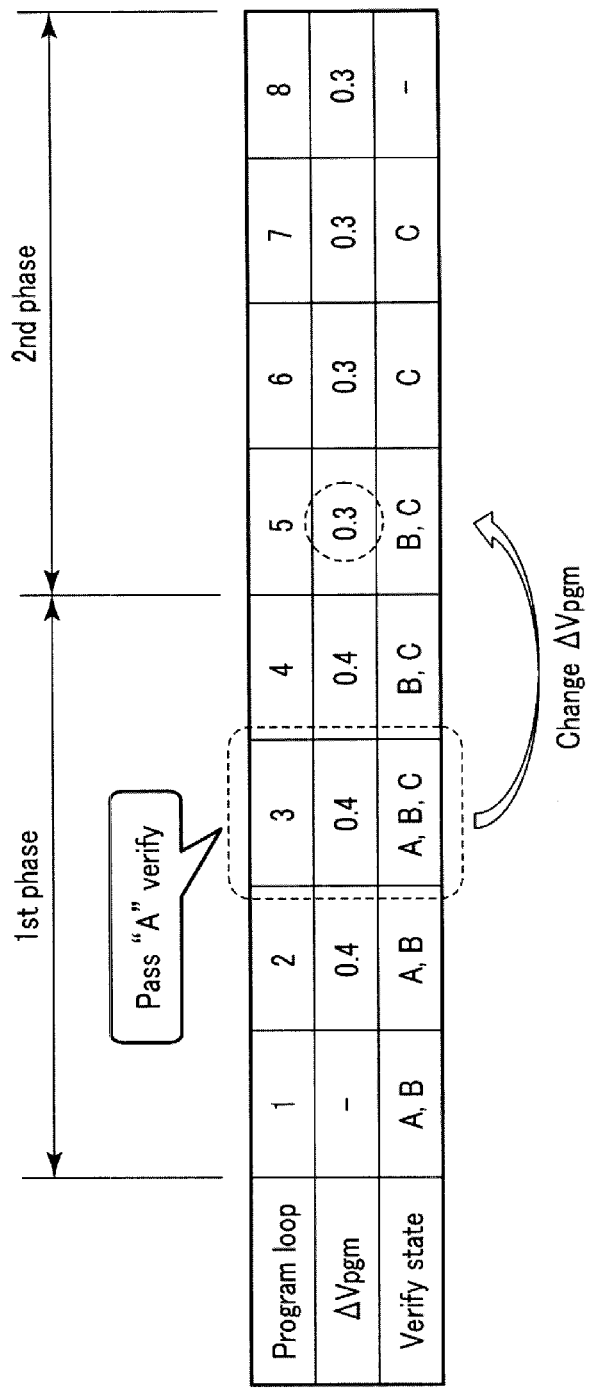
FIG. 12 is a diagram illustrating the write operation in the semiconductor memory device according to the second embodiment.

FIG. 12 illustrates the foregoing operation as a table of parameters corresponding to the example illustrated in FIG. 11. FIG. 12 illustrates the number of program loops, the increase amount ΔVpgm of the program voltage from an immediately previous program loop, and the level of the verifying executed in the program loop.

As illustrated in FIG. 12, in this example, the pass results in the verifying of the "A" level in the third program loop and ΔVpgm of the program voltage is changed in the fifth program loop. Specifically, while ΔVpgm is 0.4 V (ΔVpgm1) until the program loop after the pass in the verifying of the "A" level, ΔVpgm is decreased to 0.3 V (ΔVpgm2) secondarily subsequent after the pass in the verifying of the "A" level. That is, in this example, the first to fourth program loops correspond to the first phase of the write operation and the fifth to eighth program loops correspond to the second phase of the write operation.

In this way, in the write operation of the semiconductor memory device 10 according to the present embodiment, based on the pass in the verifying of the "A" level, ΔVpgm is made smaller from the subsequent program loop. In the present embodiment, for example, the pass in the verifying of the "A" level is used as a trigger to change ΔVpgm, as described above. However, an embodiment is not limited thereto. For example, the pass in the verifying of the "B" level may be used as the trigger to change ΔVpgm.

In the present embodiment, for example, the detection operation is executed at the same step as that of the program operation, as described above. However, an embodiment is not limited thereto. For example, a timing at which the detection operation starts in each program loop may be deviated from a timing at which the program operation starts in the subsequent program loop. The detection operation may start immediately after the verifying operation of steps S21 and S26.

[2-2] Advantages of Second Embodiment

Next, the advantages of the second embodiment will be described. The semiconductor memory device 10 according to the present embodiment can accelerate the write operation more than in the first embodiment. The details of the advantages will be described below.

In the program loop of the write operation in the semiconductor memory device 10, the detection operation executed in each verifying is one cause for reducing the operation speed.

Accordingly, the semiconductor memory device 10 according to the present embodiment execute the detection operation of each program loop and the program operation of the subsequent program loop in parallel. Specifically, the program voltage stepped up and the program operation is executed without waiting the end of the detection operation continuing from the verifying operation. Then, since a time of the detection operation can be eliminated, it is possible to compress the time of the write operation.

In this way, the semiconductor memory device 10 according to the present embodiment can improve the reliability of the written data as in the first embodiment and further accelerate the write operation more than in the first embodiment.

[3] Third Embodiment

Next, a semiconductor memory device according to a third embodiment will be described. In third embodiment, a program voltage is changed to be smaller than in the write operation described in the first embodiment. Hereinafter, differences from the first and second embodiments will be described.

[3-1] Write Operation

Figure 13:
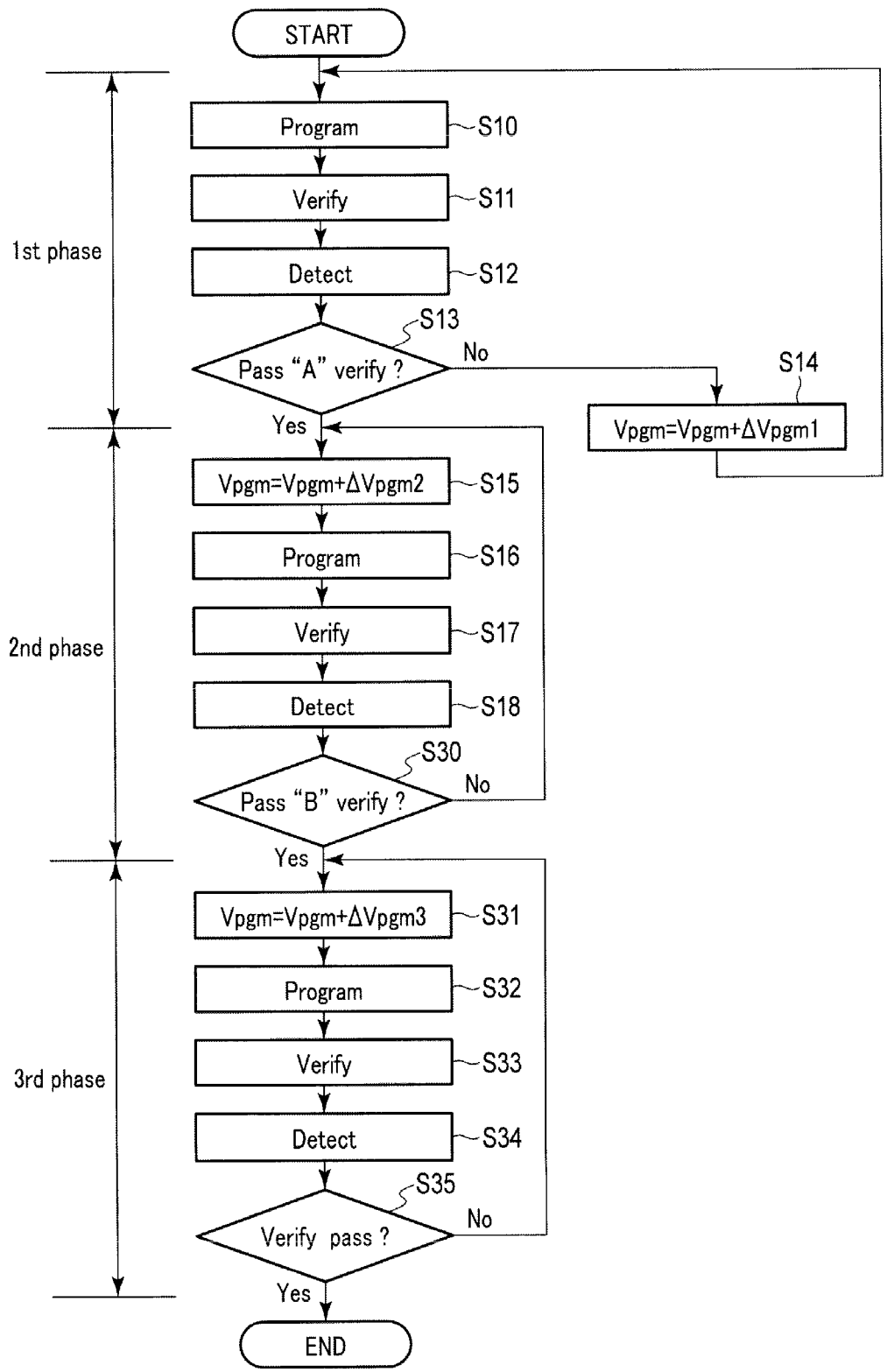
FIG. 13 is a flowchart illustrating a write operation in a semiconductor memory device according to a third embodiment.
Figure 14:
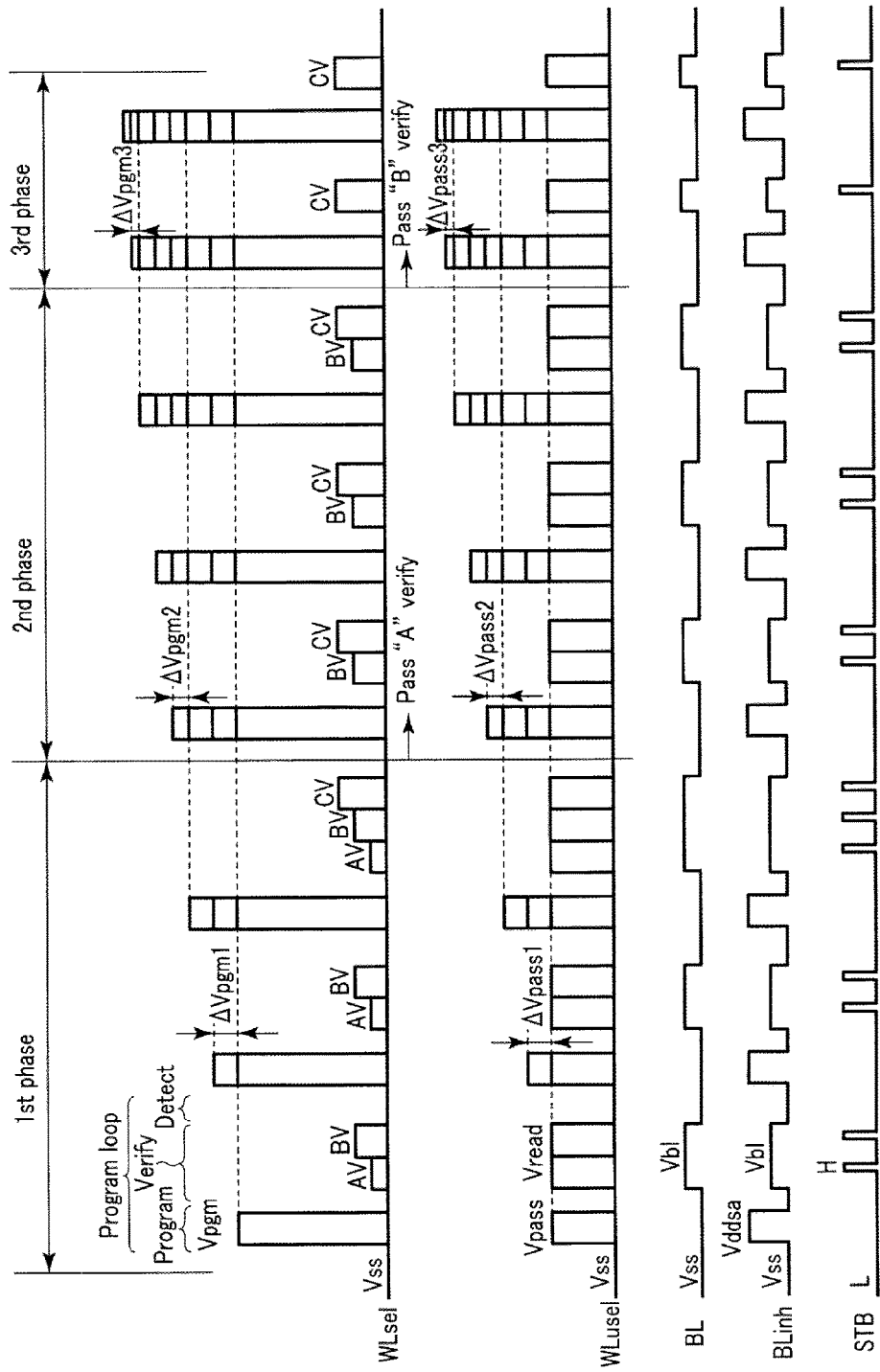
FIG. 14 is a diagram illustrating waveforms of the write operation in the semiconductor memory device according to the third embodiment.

First, a write operation of the semiconductor memory device 10 will be described with reference to FIGS. 13 and 14. FIG. 13 is a flowchart illustrating the write operation. FIG. 14 illustrates an example of the write operation as a timing chart.

As illustrated in FIG. 13, the write operation of the present embodiment can be divided into three phases including program loops. The phases are referred to as first to third phases of the write operation in order of the execution of the phases. Operations of the phases will be described below. The specific operation in the program loop of each phase illustrated in FIG. 14 is the same as the operation in FIG. 7 described in the first embodiment, and thus the description thereof will be omitted.

The first phase of the write operation is the same as the phase in FIG. 7 described in the first embodiment. That is, until the pass results in the verifying of the "A" level, the program voltage Vpgm and the writing pass voltage Vpass are increased by $\Delta$Vpgm1 and $\Delta$Vpass1 and the program loop is repeated. When the pass results in the verifying of the "A" level, the write operation proceeds to the second phase.

In the subsequent second phase of the write operation, the operation of step S19 in FIG. 7 described in the first embodiment is replaced with the confirmation (step S30) of the verifying result of the "B" level.

Specifically, as in FIG. 7 described in the first embodiment, sequencer 17 increases the voltages Vpgm and Vpass by $\Delta$Vpgm2 and $\Delta$Vpass2 lower than $\Delta$Vpgm1 and $\Delta$Vpass1 (step S15). Subsequently, the sequencer 17 executes the program operation, the verifying operation, and the detection operation in order (steps S16 to S18). When the fail results in the verifying of the "B" level (No in step S30), the operation returns to step S15.

That is, until the pass in the verifying of the "B" level, the program voltage Vpgm and the writing pass voltage Vpass are increased by $\Delta$Vpgm2 and $\Delta$Vpass2 and the program loop is repeated. When the verifying of the "B" level results in a pass (Yes in step S30), the write operation proceeds to the third phase.

In the program loop in the subsequent third phase of the write operation, the amount of the program voltage Vpgm increased for each program loop is made smaller than in the second phase.

Specifically, the sequencer 17 increases the voltages Vpgm and Vpass by $\Delta$Vpgm3 and $\Delta$Vpass3 (step S31). $\Delta$Vpgm3 and $\Delta$Vpass3 are lower than $\Delta$Vpgm2 and $\Delta$Vpass2, respectively. Subsequently, the sequencer 17 executes the program operation, the verifying operation, and the detection operation in order (steps S32 to S34). The operation of the program loop corresponding to the steps S32 to S34 is the same as the operation of the program loop corresponding to steps S10 and S12.

Next, the sequencer 17 confirms whether the pass results in the verifying of the remaining levels (step S35). Here, when the fail results in the verifying (No in step S35), the operation returns to step S31.

In the third phase of the write operation described above, the program voltage Vpgm and the writing pass voltage Vpass are increased by $\Delta$Vpgm3 and $\Delta$Vpass3, the program loop is repeated. Then, when the pass results in the verifying of the remaining levels (Yes in step S35), the semiconductor memory device 10 ends the write operation.

Figure 15:
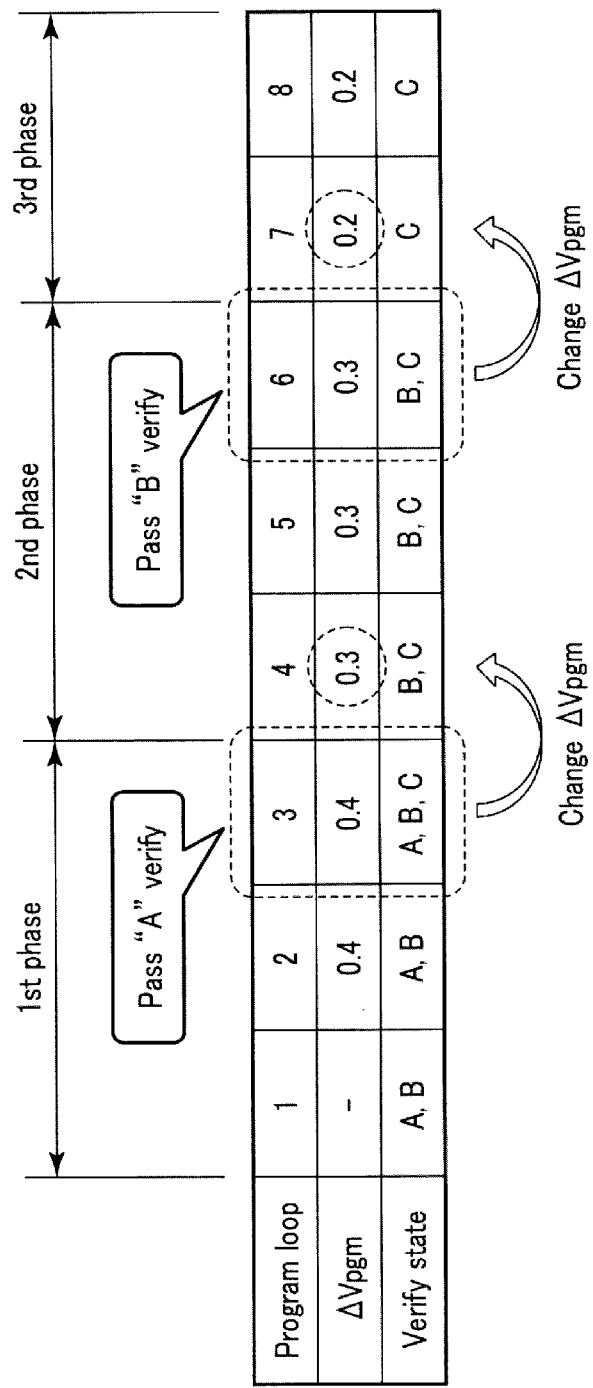
FIG. 15 is a diagram illustrating the write operation in the semiconductor memory device according to the third embodiment.

FIG. 15 illustrates the foregoing operation as a table of parameters corresponding to the example illustrated in FIG. 14. FIG. 15 illustrates the number of program loops, the increase amount $\Delta$Vpgm of the program voltage from the immediately previous program loop, and the level of the verifying executed in the program loop.

As illustrated in FIG. 15, this example is different from the example described in FIG. 8 in that the pass further results in the verifying of the "B" level in the sixth program loop and $\Delta$Vpgm is changed in the seventh program loop.

Specifically, while $\Delta$Vpgm until the pass in the verifying of the "B" level is 0.3 V ($\Delta$Vpgm2), $\Delta$Vpgm after the pass in the verifying of the "B" level is decreased to 0.2 V ($\Delta$Vpgm3). That is, in this example, the first to third program loops correspond to the first phase of the write operation, the fourth to sixth program loops correspond to the second phase of the write operation, the seventh and eighth program loops correspond to the third phase of the write operation.

[3-2] Advantages of Third Embodiment

Next, the advantages of the third embodiment will be described. The semiconductor memory device 10 according to the present embodiment can improve reliability of the data more than in the first embodiment. The details of the advantages will be described below.

In the write operation of the semiconductor memory device, as described in the section "Advantages of First Embodiment", the optimum value of $\Delta$Vpgm for each program slope is changed with progress of the write operation.

Accordingly, the semiconductor memory device 10 according to the present embodiment decreases $\Delta$Vpgm in one another phase for each program slope during the write operation, as compared to the first embodiment. Specifically, for example, after the pass in the verifying of the "A" level and the pass in the verifying of the "B" level, $\Delta$Vpgm is made smaller. In this way, the timing at which $\Delta$Vpgm is reduced is based on the pass in the verifying of the predetermined level as in the first embodiment.

That is, in the semiconductor memory device 10 according to the present embodiment, the write operation is classified into three phases and $\Delta$Vpgm of each program loop is changed in each phase. For $\Delta$Vpgm of each program slope in the three phases, $\Delta$Vpgm in the latter phases is made smaller to improve the program slope in each phase.

In this way, in the write operation of the semiconductor memory device 10 according to the present embodiment, it is possible to reduce the size of the final program voltage since the gap between the increase amount of the threshold voltage for each program loop in the latter phases of the write operation and the increase amount of the program voltage is smaller than in the earlier phases. Accordingly, the semiconductor memory device 10 according to the present embodiment can reduce the program disturbance more than in the first embodiment, and thus can improve the reliability of the written data.

[4] Fourth Embodiment

Next, a semiconductor memory device according to a fourth embodiment will be described. In the fourth embodiment, a quick pass write (QPW) scheme is applied to the write operation described in the first embodiment. Hereinafter, differences from the first to third embodiments will be described.

[4-1] Write Operation

Figure 16:
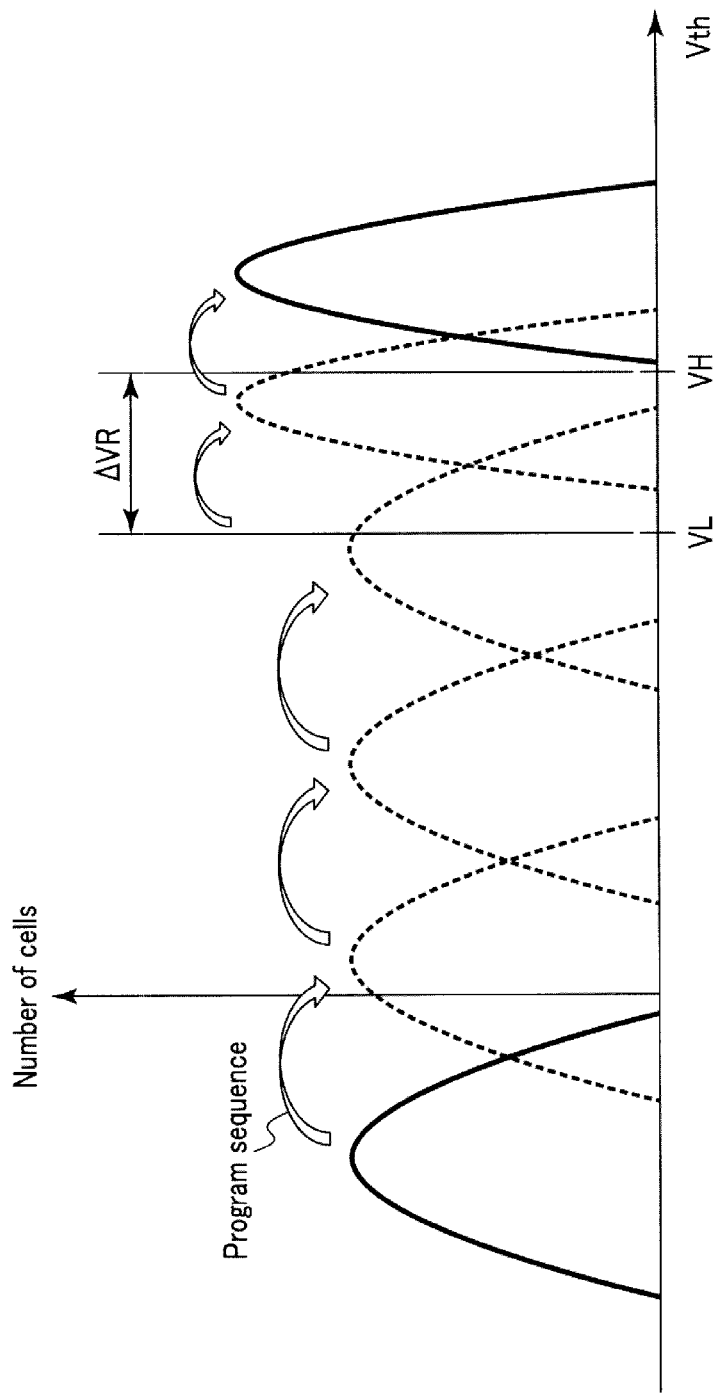
FIG. 16 is a diagram illustrating a write operation in a semiconductor memory device according to a fourth embodiment.
Figure 17:
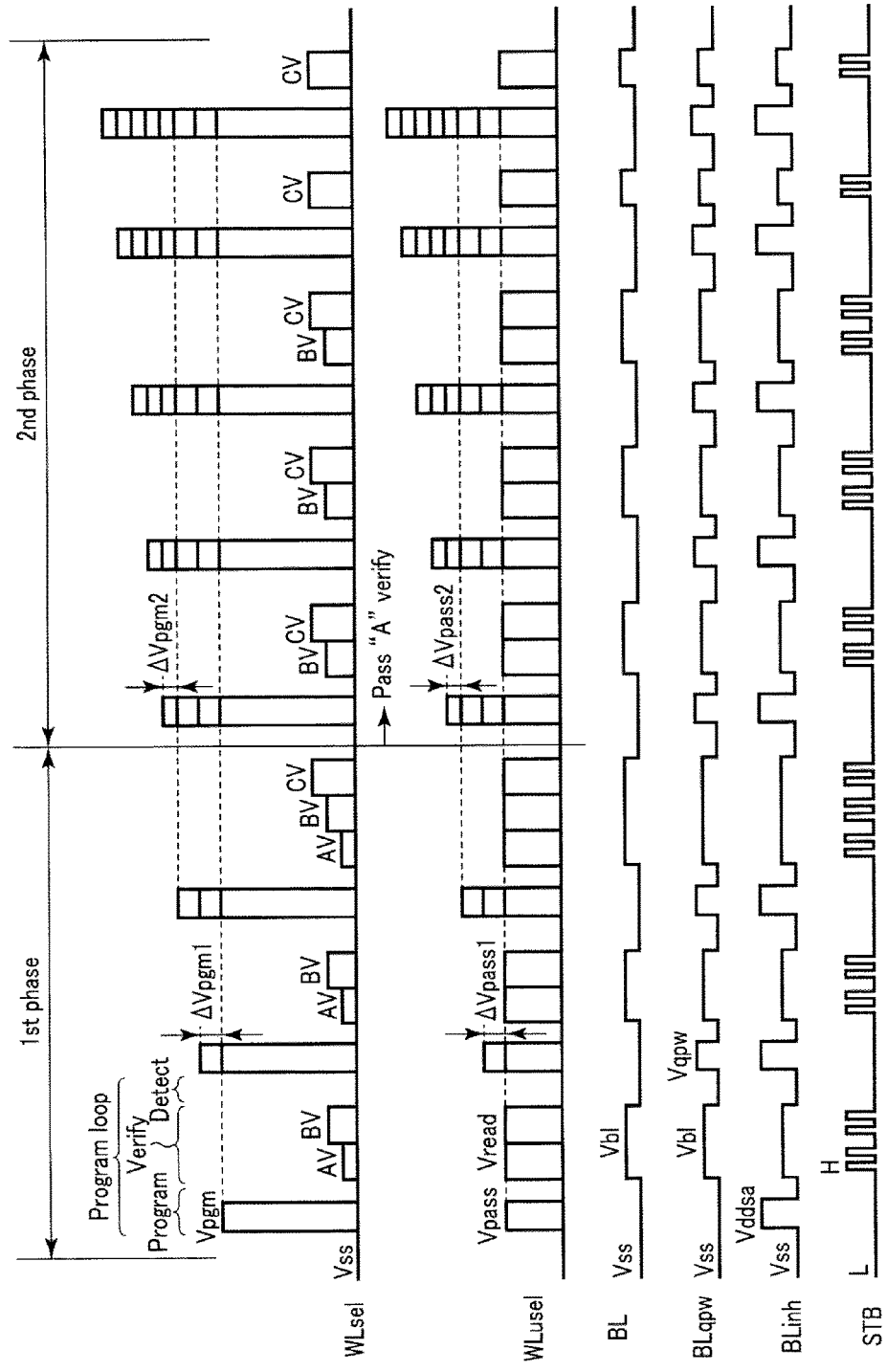
FIG. 17 is a diagram illustrating waveforms of the write operation in the semiconductor memory device according to the fourth embodiment.

First, a write operation to which the QPW scheme is applied will be described with reference to FIGS. 16 and 17. FIG. 16 illustrates a shift form of the threshold voltage distribution of the memory cell through the write operation to which the QPW scheme is applied. FIG. 17 illustrates an example of the write operation as a timing chart.

As illustrated in FIG. 16, two kinds of verifying voltages VH and VL are set for each writing level in the write operation of the QPW scheme. The voltage VH corresponds to a final target threshold voltage of the memory cell. The voltage VL is set to be lower by an arbitrary value ΔVR than the voltage VH.

In the program operation when the QPW scheme is applied, three kinds of voltages illustrated in FIG. 17 are applied to the bit lines BL based on the immediately previous verifying result.

Specifically, when the threshold voltage of the memory cell transistor MT is less than the voltage VL, the voltage Vss is applied to the bit lines BL. At this time, since a high potential difference occurs between the channel and the control gate of the memory cell transistor MT, the threshold voltage of the memory cell transistor MT increases.

When the threshold voltage of the memory cell transistor MT is equal to or higher than the voltage VL and lower than the voltage VH, a voltage Vqpw is applied to corresponding bit lines BLqpw. The voltage Vqpw is set between the voltages Vss and Vddsa. At this time, a potential difference occurring between the channel and the control gate of the memory cell transistor MT is smaller than a case where the voltage Vss is applied to the bit line BL. Then, an increase amount of the threshold voltage of the memory cell transistor MT is smaller than a case where the voltage Vss is applied to the bit line BL.

When the threshold voltage of the memory cell transistor MT is equal to or higher than the voltage VH, the voltage Vddsa is applied to the corresponding bit line BLinh. At this time, since the select transistors ST1 are not turned on and the voltage of the channel is boosted, a variation in the threshold voltage of the memory cell transistor MT is suppressed.

As described above, in the write operation to which QPW scheme is applied, the verifying voltage VL lower than the target verifying voltage VH is set. When the threshold voltage of the memory cell transistor MT exceeds the verifying voltage VL, a variation amount of the threshold voltage is decreased through the program operation in which the bit line BL is charged with the voltage Vqpw. Then, as illustrated in FIG. 17, the threshold voltage distribution of the memory cell transistor MT for which the write operation end becomes thin. The other operations are the same as those in FIG. 7 described in the first embodiment.

While the verifying voltage corresponding to each level is applied, the two-time signal STB is asserted, in FIG. 17. The two-time signal STB corresponds to verifying reading of the verifying voltages VL and VH of each level. The verifying reading corresponding to the voltages VL and VH is achieved by providing a threshold in a current amount to be detected.

In the present embodiment, for example, the verifying reading of the voltages VL and VH is achieved when the verifying voltages to be applied are constant, as described above. However, an embodiment is not limited thereto. For example, each verifying reading may be executed by applying the verifying voltages VL and VH of each level to the word line WL in order.

Further details of the QPW scheme are disclosed in U.S. patent application Ser. No. 14/263,948, filed on Apr. 28, 2014, titled "NONVOLATILE SEMICONDUCTOR MEMORY DEVICE," and U.S. patent application Ser. No. 12/563,296, filed on Sep. 21, 2009, titled "NONVOLATILE SEMICONDUCTOR MEMORY DEVICE." The entire contents of these patent applications are incorporated by reference in the present specification.

[4-2] Advantages of Fourth Embodiment

Next, the advantages of the fourth embodiment will be described. The semiconductor memory device 10 according to the present embodiment can improve reliability of the written data more than in the first embodiment. The details of the advantages will be described below.

As a writing method of a semiconductor memory device, the QPW scheme is known. In a write operation to which the QPW scheme is applied, a potential difference between the channel and the gate of the memory cell is decreased by charging the bit line BL and the amount of electrons injected to a charge storage layer is adjusted. When QPW scheme is applied, the threshold voltage distribution becomes thin, and therefore the reliability of the written data is improved. The writing method of the QPW scheme can also be applied to the semiconductor memory device 10 according to the first embodiment.

Accordingly, in the semiconductor memory device 10 according to the present embodiment, the writing method of the QPW scheme is applied to the semiconductor memory device 10 according to the first embodiment. In this way, the semiconductor memory device 10 according to the present embodiment can obtain the advantage that the distribution of the threshold voltage becomes thin by further applying the QPW scheme to the semiconductor memory device 10 according to the first embodiment. That is, the semiconductor memory device according to the present embodiment can improve the reliability of the written data more than in the first embodiment.

The writing method of the QPW scheme can also be applied to the semiconductor memory device 10 according to the second and third embodiments. That is, the semiconductor memory device 10 according to the second and third embodiment can also improve the reliability of the written data by applying the QPW scheme.

[5] Fifth Embodiment

Next, a semiconductor memory device according to a fifth embodiment will be described. In the fifth embodiment, the write operation described in the first embodiment is modified, so that a timing at which an increase amount of the program voltage for each program loop is changed is based on the number of times the program loop is executed. Hereinafter, differences from the first to fourth embodiments will be described.

[5-1] Write Operation

Figure 18:
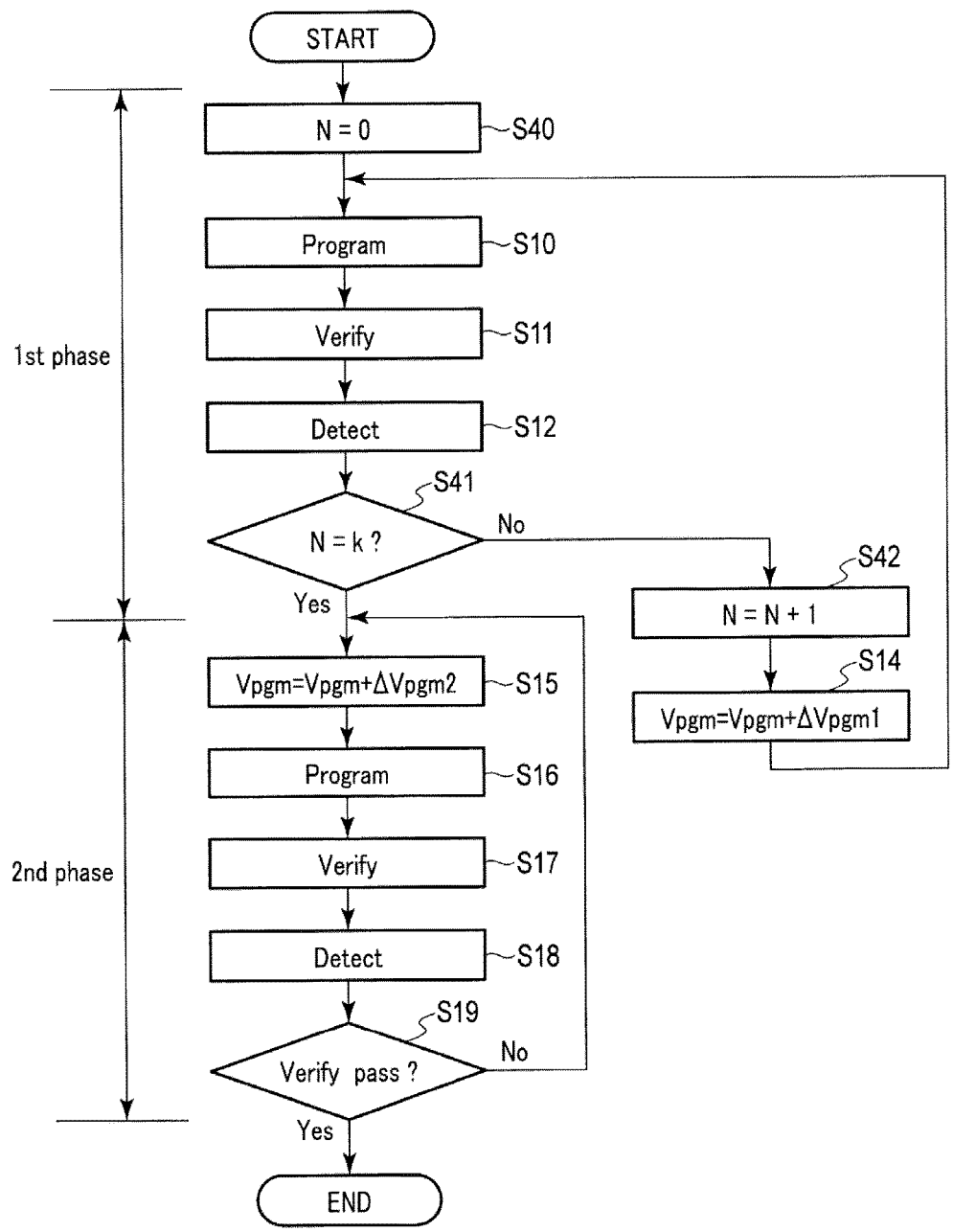
FIG. 18 is a flowchart illustrating a write operation in a semiconductor memory device according to a fifth embodiment.
Figure 19:
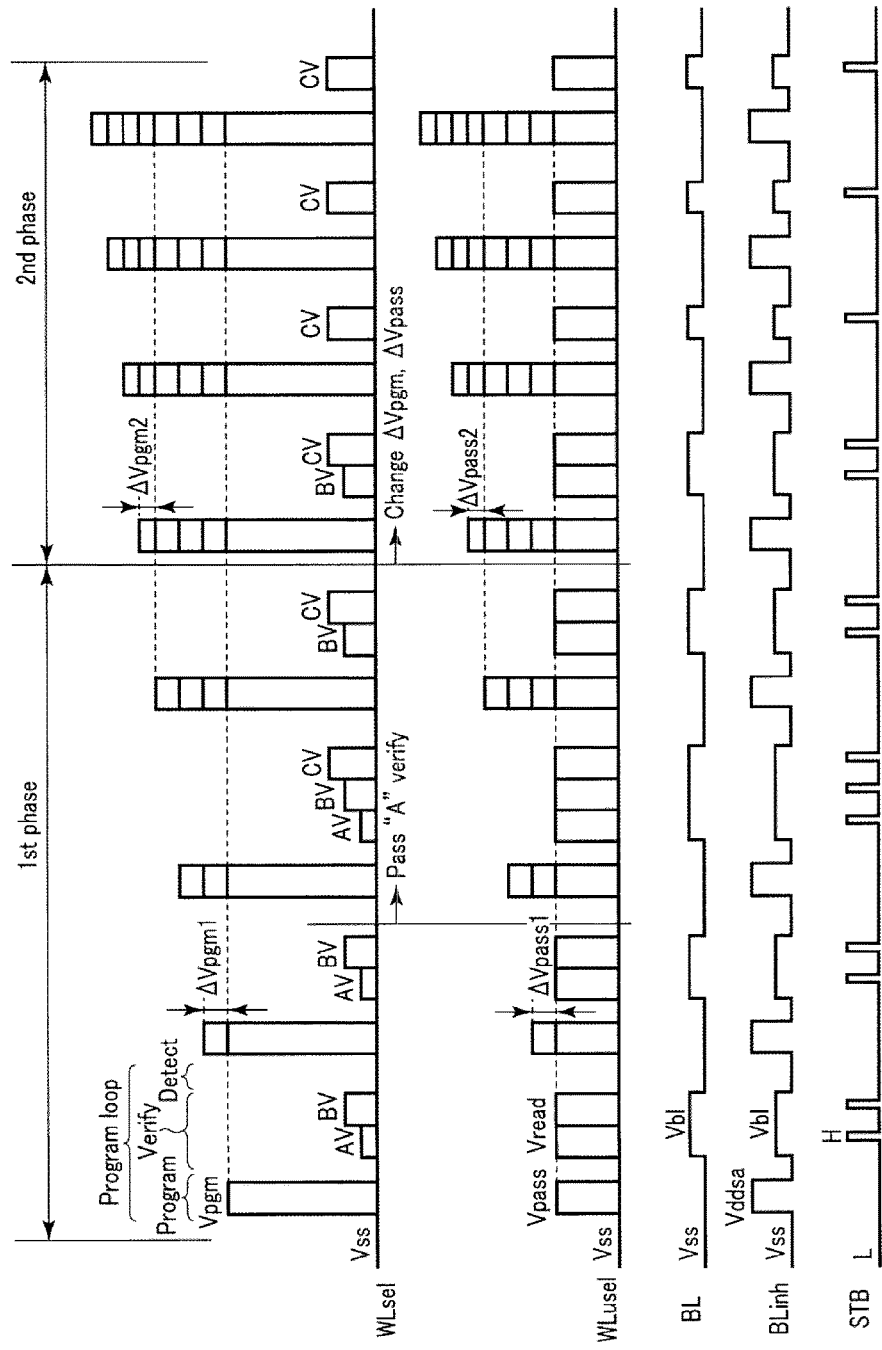
FIG. 19 is a diagram illustrating waveforms of the write operation in the semiconductor memory device according to the fifth embodiment.

First, a write operation of the semiconductor memory device 10 will be described with reference to FIGS. 18 and 19. FIG. 18 is a flowchart illustrating the write operation. FIG. 19 illustrates an example of the write operation as a timing chart.

As illustrated in FIG. 18, the write operation in the present embodiment can be divided into two phases including program loops, as in the first embodiment. Operations of the phases will be described below. The specific operation in the program loop of each phase illustrated in FIG. 19 is the same as the operation in FIG. 7 described in the first embodiment, and thus the description thereof will be omitted.

First, the first phase of the write operation will be described.

The sequencer 17 first resets a counter (N=0, step S40). Subsequently, the sequencer 17 executes the program operation, the verifying operation, and the detection operation in order (steps S10 to S12).

Next, the sequencer 17 confirms the number of times the program loop corresponding to steps S10 to S12 is repeated is with reference to a counter (step S41). Here, when a numerical value of the counter is less than k (where k is a natural number equal to or greater than 1) (No in step S41), the sequencer 17 increases the counter (step S42). The numerical value k indicates the number of times the program loop is repeated in the first phase of the write operation and is set as any numerical value. Subsequently, the sequencer 17 increases the program voltage Vpgm and the writing pass voltage Vpass by ΔVpgm1 and ΔVpass1 (step S14), and then the operation returns to step S10.

In the first step of the write operation, as described above, as in the first embodiment, the program voltage Vpgm and the writing pass voltage Vpass are increased by ΔVpgm1 and ΔVpass1 and the program loop corresponding steps S10 to S12 is repeated. When the numerical value of the counter is identical to k (Yes in step S41), that is, when the number of times the program loop is repeated in the first phase of the write operation reaches k times, the write operation of the semiconductor memory device 10 proceeds to the second phase. The second phase of the write operation is the same as that in FIG. 6 described in the first embodiment, and thus the description thereof will be omitted.

Figure 20:
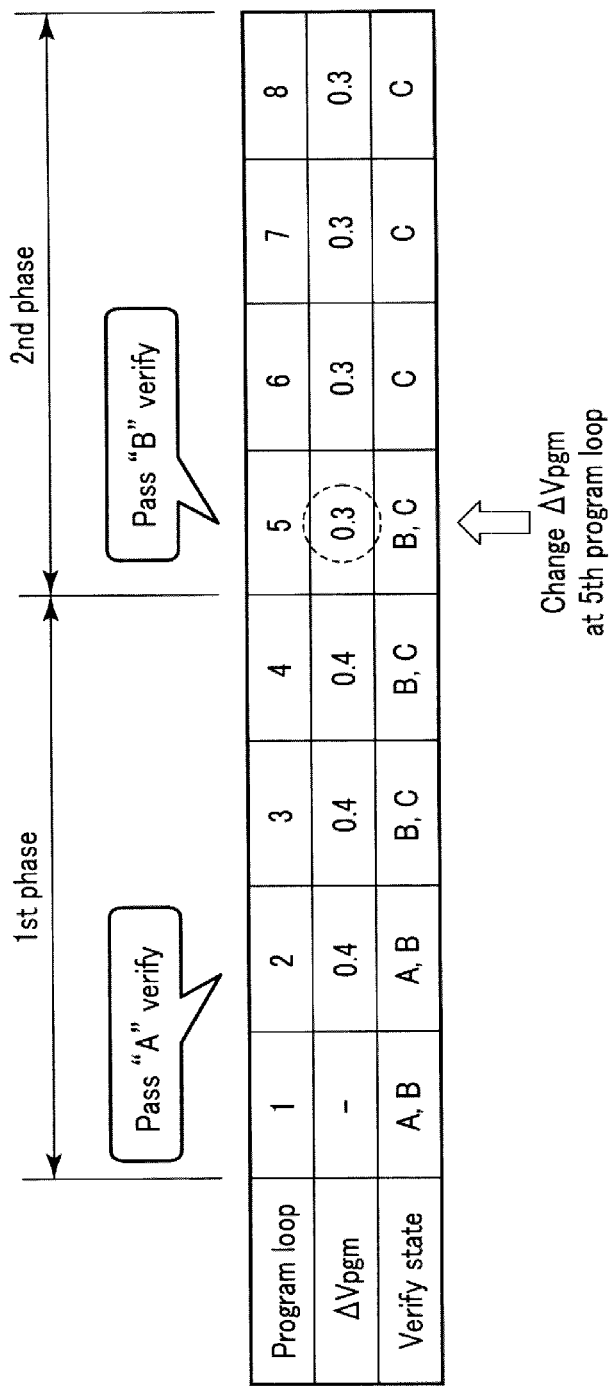
FIG. 20 is a diagram illustrating the write operation in the semiconductor memory device according to the fifth embodiment.

FIG. 20 illustrates the foregoing operation as a table of parameters corresponding to the example illustrated in FIG. 19. FIG. 20 illustrates the number of program loops, the increase amount ΔVpgm of the program voltage from the immediately previous program loop, and the level of the verifying executed in the program loop.

In this example, as illustrated in FIG. 20, the increase amount ΔVpgm of the program voltage is changed from 0.4 to 0.3 in the fifth program loop. Specifically, this example is an example in which k=3 is set. The program loop is repeated three times in the first phase. That is, the first phase of the write operation ends in the fourth program loop and the write operation proceeds to the second phase from the program loop after the fifth program loop.

As described above, the write operation of the semiconductor memory device 10 according to the present embodiment proceeds from a first period to a second period based on the number of times the program loop is executed during the first period. In other words, the semiconductor memory device 10 detects that the number of times the program loop is executed reaches a predetermined number of times, and then changes ΔVpgm for each program loop to a smaller value.

In this way, in the present embodiment, a timing at which ΔVpgm is changed does not depend on a timing of the pass in the verifying. Accordingly, in the semiconductor memory device according to the present embodiment, the pass results in the verifying of the "A" level, and then ΔVpgm is changed in the program loop after three or more program loops in some cases, as illustrated in FIG. 19, unlike the first and second embodiments.

[5-2] Advantages of Fifth Embodiment

Next, the advantages of the fifth embodiment will be described. The semiconductor memory device 10 according to the fifth embodiment can improve reliability of the written data, as in the first embodiment. The details of the advantages will be described below.

In the write operation of the semiconductor memory device according to the present embodiment, as a trigger to change ΔVpgm for each program loop, the verifying result is referred to. However, the threshold voltage of the memory cell during the write operation can be predicted to some extent by the number of times the program loop is repeated.

Accordingly, the semiconductor memory device 10 according to the present embodiment determines a timing at which the increase amount ΔVpgm of the program voltage for each program loop is decreased based on the number of program loops. Specifically, the number of program loops is counted, and then ΔVpgm for each program loop is decreased after the program loop is executed by a predetermined number of times.

In this way, the semiconductor memory device 10 according to the present embodiment can reduce the size of the final program voltage, as in the first embodiment. Accordingly, the semiconductor memory device 10 according to the present embodiment can reduce the program disturbance, and thus can improve the reliability of the written data, as in the first embodiment.

The semiconductor memory device 10 according to the present embodiment may set ΔVpgm of three phases, as in the third embodiment. In this case, two kinds of numbers of program loops are set to designate a timing at which ΔVpgm for each program loop is changed, and ΔVpgm is considered to be small at each timing in the write operation.

When the timing at which ΔVpgm for each program loop is changed is desired to be constant as in the present embodiment, the semiconductor memory device may change ΔVpgm for each program loop based on the voltage value of the program voltage Vpgm for each program loop. In this case, the operation is executed in, for example, the flowchart illustrated in FIG. 21.

Figure 21:
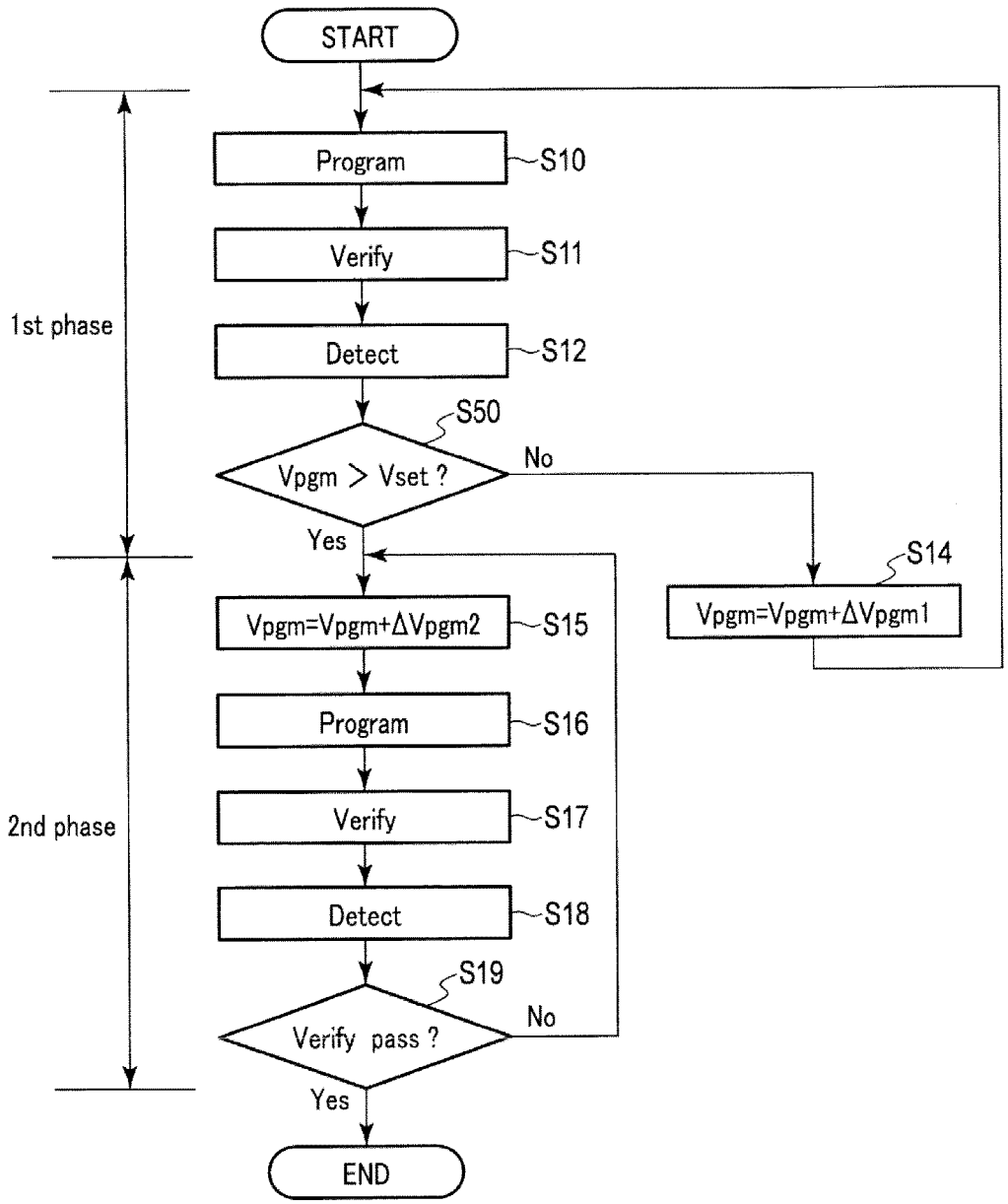
FIG. 21 is a flowchart illustrating the write operation in the semiconductor memory device according to the fifth embodiment.

In an operation illustrated in FIG. 21, the operations of steps S40 and S42 in FIG. 18 described in the present embodiment are deleted and the operation of step S41 is replaced with an operation (step S50) of determining the voltage value of the program voltage Vpgm. Specifically, in step S50, the sequencer 17 determines whether the voltage value of the program voltage Vpgm stepped up for each program loop exceeds Vset. The voltage value Vset is set as an arbitrary value greater than an initial value of the program voltage Vpgm.

When the value of the program voltage Vpgm is equal to or less than Vset (No in step S50), the operation proceeds to step S14, the program voltage is stepped up, and the program loop is repeated. Conversely, when the program loop is repeated and the voltage value of the program voltage Vpgm exceeds Vset (Yes in step S50), the operation proceeds to step S15 and the program loop in which a step-up amount for each program loop is small is repeated.

That is, in this example, the write operation proceeds from the first period to the second period based on the value of the program voltage Vpgm for each program loop executed during the first period illustrated in FIG. 21. The other operations are the same as those in FIG. 18 described in the present embodiment, and thus the description thereof will be omitted.

As described above, it is determined whether the program voltage stepped up for each program loop exceeds a predetermined voltage value, and ΔVpgm for each program loop is considered to be small. Accordingly, the semiconductor memory device can reduce the program disturbance as in the first embodiment, and thus can improve the reliability of the written data.

In the example illustrated in FIG. 21, whether the program voltage Vpgm exceeds the predetermined voltage value is used as the trigger to change ΔVpgm, but an embodiment is not limited thereto. For example, ΔVpgm may be changed when the program voltage Vpgm is identical to a predetermined voltage value.

[6] Sixth Embodiment

Next, a semiconductor memory device according to a sixth embodiment will be described. The sixth embodiment is an example in which the write operation according to the first embodiment is applied to sequential writing of 3-bit data or 4-bit data. Hereinafter, differences from the first to fifth embodiments will be described.

[6-1] Threshold Voltage Distribution of Memory Cell

Figure 22:
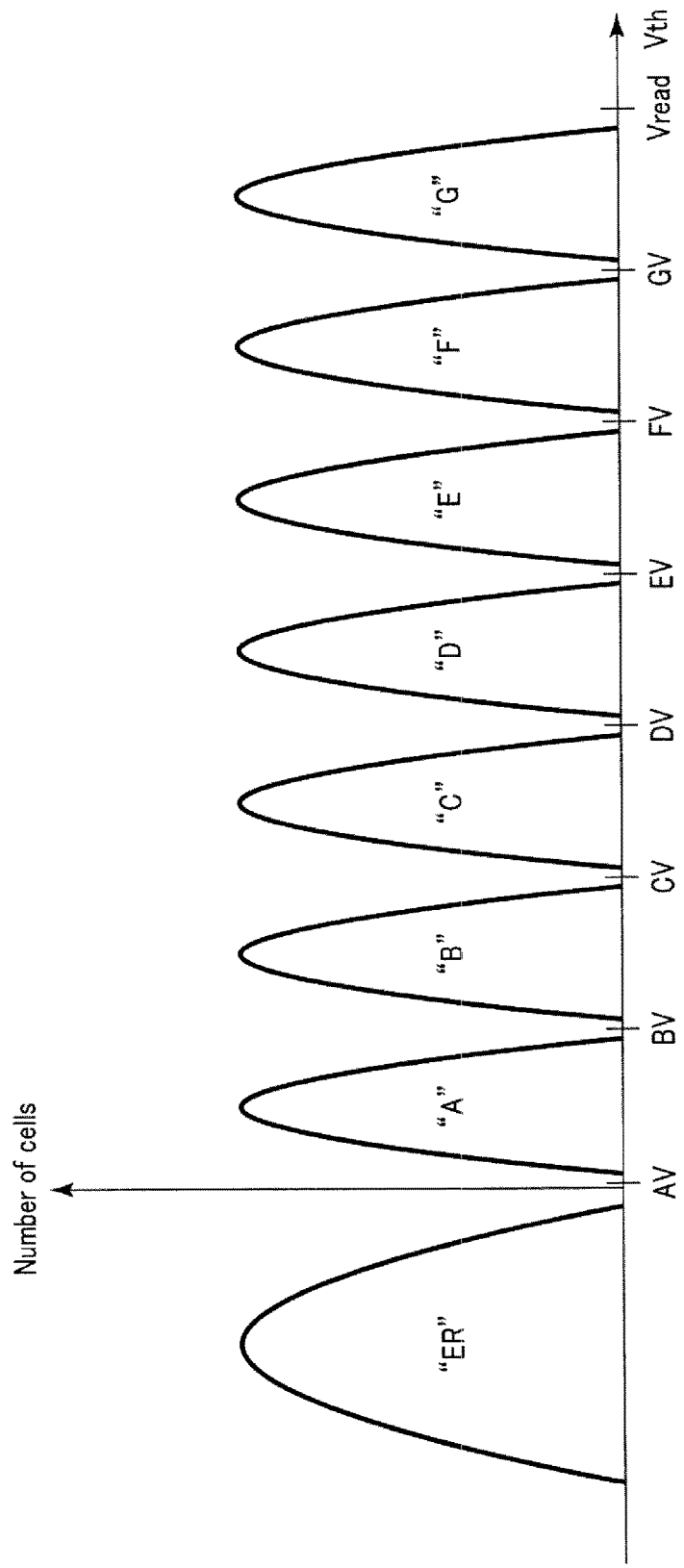
FIG. 22 is a diagram illustrating a threshold voltage distribution of a memory cell included in a semiconductor memory device according to a sixth embodiment.
Figure 23:
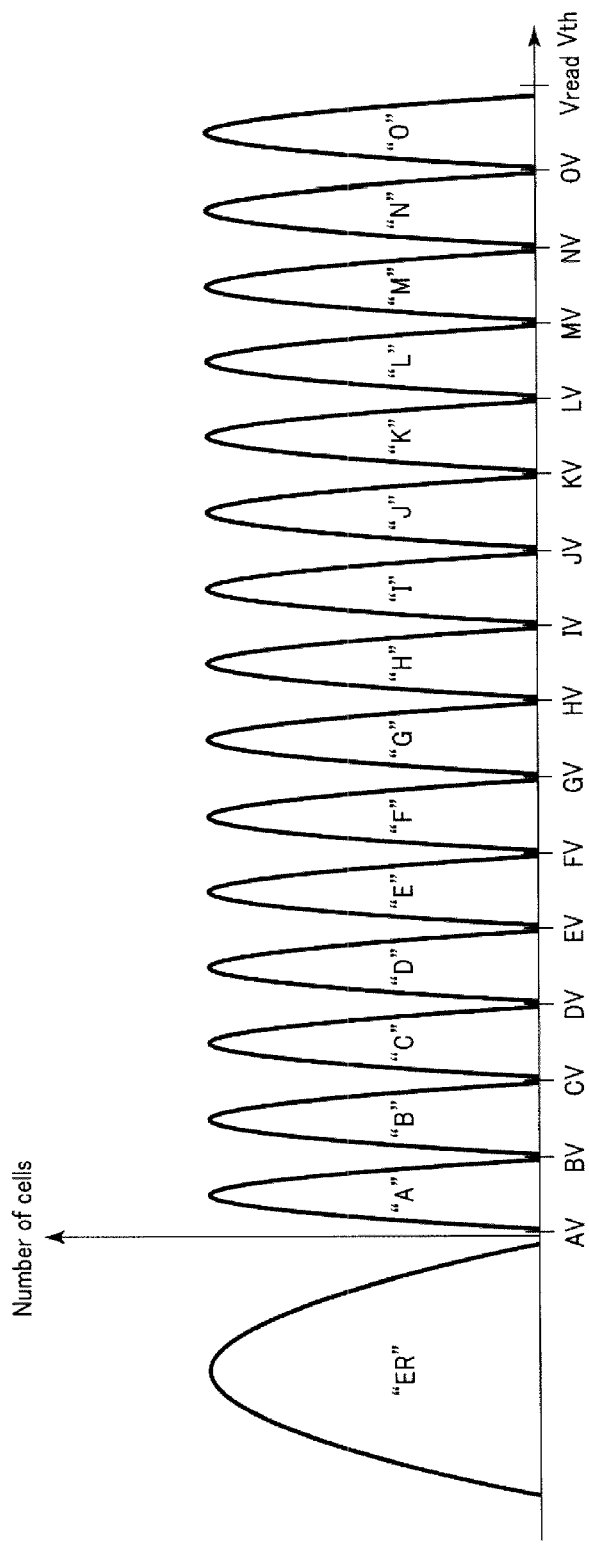
FIG. 23 is a diagram illustrating a threshold voltage distribution of the memory cell included in the semiconductor memory device according to the sixth embodiment.

First, threshold voltage distributions of the memory cell transistors MT will be described with reference to FIGS. 22 and 23. FIGS. 22 and 23 illustrate the threshold voltage distributions of the memory cells storing 3-bit data and 4-bit data, respectively. In FIGS. 22 and 23, the vertical axis represents the number of memory cells and the horizontal axis represents a threshold voltage Vth.

The semiconductor memory device 10 can execute a write operation of a triple level cell (TLC) scheme of storing 3-bit data in one memory cell or a write operation of a quadruple level cell (QLC) scheme of storing 4-bit data in one memory cell.

When the memory cell retains the 3-bit data, the distribution of the threshold voltage is divided into 9 threshold voltage distributions, as illustrated in FIG. 22. The pieces of 3-bit data corresponding to the 9 threshold voltage distributions are referred to as an "ER" level, an "A" level, a "B" level, a "C" level, a "D" level, an "E" level, an "F" level, and a "G" level in order from the threshold voltage distribution in which the threshold voltage is low.

Conversely, when the memory cell retains the 4-bit data, the distribution of the threshold voltage is divided into 16 threshold voltage distributions, as illustrated in FIG. 23. The pieces of 4-bit data corresponding to the 16 threshold voltage distributions are referred to as an "ER" level, an "A" level, a "B" level, a "C" level, a "D" level, an "E" level, an "F" level, a "G" level, an "H" level, an "I" level, a "J" level, a "K" level, an "L" level, an "M" level, an "N" level, and an "O" level, in order from the threshold voltage distribution in which the threshold voltage is low.

In this way, when the memory cell retains the data of a plurality of bits, the number of peaks of the threshold voltage distribution increases as the number of bits to be stored increases. When a write operation and a read operation are executed on the memory cells storing the 3-bit data and the 4-bit data, a verifying voltage and a reading voltage are set as in the case of 2 bits described in FIG. 4.

[6-2] Write Operation

Next, a write operation of the semiconductor memory device 10 will be described.

In the sixth embodiment, the write operation of the first embodiment is applied to the sequential writing of the 3-bit data or the 4-bit data. Specifically, for example, when the sequential writing for the 3-bit data is executed, the increase amount ΔVpgm of the program voltage for each program loop is decreased after the pass in the verifying of one level of "A" to "F". Similarly, when the sequential writing for the 4-bit data is executed, the increase amount ΔVpgm of the program voltage for each program loop is decreased after the pass in the verifying of one level of "A" to "M".

In this operation, the operation corresponding to step S13 in the flowchart illustrated in FIG. 6 described in the first embodiment is changed to an operation of confirming whether a pass results in verifying of a desired level.

[6-3] Advantages of Sixth Embodiment

Next, the advantages of the sixth embodiment will be described. The semiconductor memory device 10 according to the present embodiment can improve reliability of the written data even when the 3-bit data and the 4-bit data is stored in the memory cell. The details of the advantages will be described below.

In the semiconductor memory device, when the memory cell retains the data of the plurality of bits, the peaks of the threshold voltage distribution increases based on the number of bits to be retained. The peaks of the threshold voltage distribution are formed between a voltage of an erasing level and a reading voltage. That is, as the number of bits of the data stored by the memory cell increases, an interval of the threshold voltage distribution corresponding to the level of each piece data is narrowed and the influence of the program disturbance is increased.

Accordingly, the semiconductor memory device 10 according to the present embodiment applies the writing method of the first embodiment to the sequential writing of the 3-bit data or the 4-bit data. Specifically, in the sequential writing of the 3-bit data or the 4-bit data, ΔVpgm for each program loop is decreased based on the end of the write operation of the predetermined level, as in the first embodiment.

In this way, the semiconductor memory device 10 according to the present embodiment can lower the size of the final program voltage even when the memory cell stores the 3-bit data or the 4-bit data, and thus can reduce the program disturbance. Accordingly, the semiconductor memory device 10 according to the present embodiment can improve the reliability of the written data, as in the first embodiment.

In the foregoing description, for example, the writing method of the first embodiment is applied to the sequential writing of the 3-bit data or the 4-bit data, as described above. However, an embodiment is not limited thereto. For example, when the 3-bit data or the 4-bit data is written, the writing methods of the second to fifth embodiments can be applied. For example, when the writing method according to the third embodiment is applied in the sequential writing of the 3-bit data, ΔVpgm is changed after the pass in the verifying of two levels among "A" to "F".

[7] Seventh Embodiment

Next, a memory system according to a seventh embodiment will be described. In the seventh embodiment, a writing method of the semiconductor memory device described in the first to sixth embodiments is used properly for control of a controller. Hereinafter, differences from the first to sixth embodiments will be described.

[7-1] Write Operation

Figures 24, 25:
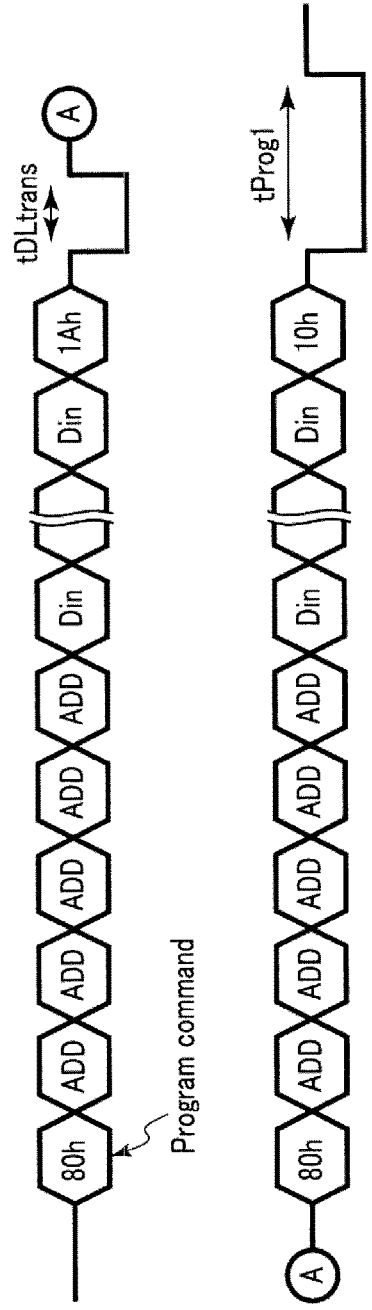
FIG. 24 is a diagram illustrating a write operation in a memory system according to a seventh embodiment.
FIG. 25 is a diagram illustrating a command sequence of a write operation in the memory system according to the seventh embodiment.

First, an overview of a write operation in a memory system 1 will be described with reference to FIG. 24. FIG. 24 illustrates two kinds of write operations and examples of combinations of the writing methods.

The memory system 1 can properly use a plurality of kinds of writing methods. For example, the semiconductor memory device 10 can execute first and second write operations under the control of the controller 20, as illustrated in FIG. 24.

For example, a normal writing method is applied to the first write operation. For example, the writing method described in the first embodiment is applied to the second write operation. This allocation of the writing methods is assumed to be case 1. Here, the normal writing method is a writing method in which the increase amount ΔVpgm of the program voltage is not changed for each program loop during the write operation.

As illustrated in cases 2 and 3 in FIG. 24, the normal writing method may be applied to the first write operation and, for example, the writing methods described in the second and third embodiments may be applied to the second write operation. Further, as illustrated in cases 4 and 5 in FIG. 24, writing methods of different embodiments may be applied to the first and second write operation.

The above-described write operation is achieved when the controller 20 changes a command to be issued based on a command from a host. Hereinafter, an example of a command sequence in the write operation of the memory system 1 will be described.

[7-1-1] Command Sequence of Write Operation

First, the command sequence of the first write operation will be described with reference to FIG. 25. FIG. 25 illustrates an example of the command sequence of the first write operation. An address and a command issued from the controller 20 in the following description are assumed to be stored in the address register 15B and the command register 15C.

In the sequential writing of 2-page data, the controller 20 divides information corresponding to write data of 2 pages into 2 pieces of information of 1 page and transmits the 2 pieces of information to the semiconductor memory device 10. First, a command sequence in which the information of the first page is transmitted will be described.

The controller 20 first issues and transmits a writing command "80h" to the semiconductor memory device 10. The command "80h" is a command for giving an instruction to start the write operation.

Next, the controller 20 issues the address information ADD, for example, every five cycles and transmits the address information ADD to the semiconductor memory device 10. The address information ADD is used to designate an address at which data is destined to be written.

Next, the controller 20 outputs write data Din to the semiconductor memory device 10 every plural cycles. The data Din output herein corresponds to the write data of 1 page and is retained in the latch circuit XDL of the sense amplifier module 12.

Subsequently, the controller 20 issues and transmits a command "1Ah" to the semiconductor memory device 10. The command "1Ah" indicates that the information transmitted here by the controller 20 corresponds to the information of 1 page in the sequential writing. When the command "1Ah" is stored in the register 15C, the sequencer 17 controls the sense amplifier unit SAU and transmits the data retained by the latch circuit XDL to the empty latch circuit (for example, the latch circuit LDL).

At this time, the ready/busy control circuit 18 sets the ready/busy signal as the "L" level and informs the controller 20 of a busy state of the semiconductor memory device 10. When the transmission of the data ends, the ready/busy control circuit 18 sets the ready/busy signal as the "H" level and informs the controller 20 of a ready state of the semiconductor memory device 10. As illustrated, tDLtrans indicates a period in which data is transmitted.

In accordance with the foregoing command sequence, the information of the first page is transmitted from the controller 20 to the semiconductor memory device 10.

A command sequence in which the information of the subsequent second page is transmitted is the same as a sequence in which the command "1Ah" is changed to a command "10h" in the command sequence in which the information of the first page is transmitted. The command "10h" causes the semiconductor memory device 10 to execute the write operation based on the immediately previously transmitted address information ADD and data Din.

When the command "10h" is retained in the register 15C, the sequencer 17 controls the sense amplifier module 12, the row decoder 13, and the like to start the first write operation. At this time, the sense amplifier module 12 decodes the column address signal CA among the information in the register and transmits the data Din retained in the latch circuit XDL to each bit line BL. The row decoder 13 decodes row address information RA among the address information in the register and applies desired voltages to the selected word lines and the unselected word line.

At this time, the ready/busy control circuit 18 sets the ready/busy signal to the "L" level and informs the controller 20 of the busy state of the semiconductor memory device 10. When the semiconductor memory device 10 ends the first write operation, the ready/busy control circuit 18 sets the ready/busy signal as the "H" level and informs the controller 20 of the ready state of the semiconductor memory device 10. As illustrated, tProg1 indicates a time in which the first write operation is executed.

Figure 26:
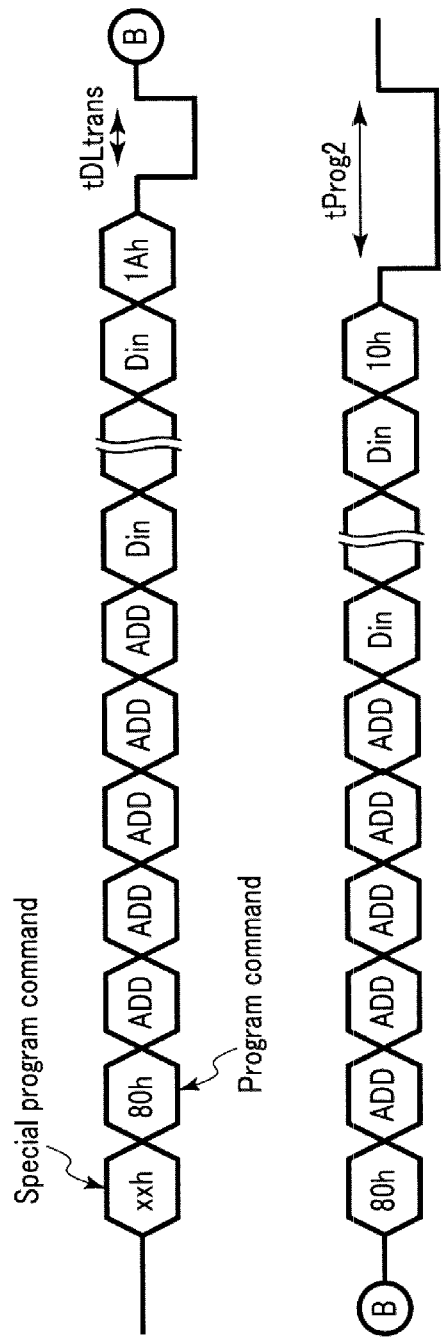
FIG. 26 is a diagram illustrating a command sequence of a write operation in the memory system according to the seventh embodiment.

Next, a command sequence of the second write operation will be described with reference to FIG. 26. FIG. 26 illustrates an example of the command sequence of the second write operation. The command sequence of the second write operation is different from the above-described command sequence of the first write operation in that a special command is added to the beginning.

Specifically, the controller 20 first issues and transmits a special command "xxh" to the semiconductor memory device 10. The command "xxh" is a command for giving an instruction to execute a write operation in accordance with a special writing method. Subsequently, the controller 20 issues and transmits the writing command "80h" to the semiconductor memory device 10. The subsequent command sequence is the same as that of the first write operation described with reference to FIG. 25. As illustrated, tProg2 indicates a time in which the second write operation is executed.

The special command "xxh" may be added to the beginning of the command sequence in which the information of at least the first page is transmitted or may be or may not be added to the command sequence in which information subsequent to the second page is transmitted.

In the above-described first and second write operations, writing methods in which processing speeds are different are normally applied. Therefore, there is a difference in a processing time between the corresponding tProg1 and tProg2.

The writing methods corresponding to the above-described first and second write operations can be changed in accordance with a parameter setting sequence referred to as a set feature.

[7-1-2] Command Sequence of Set Feature

Figure 27:
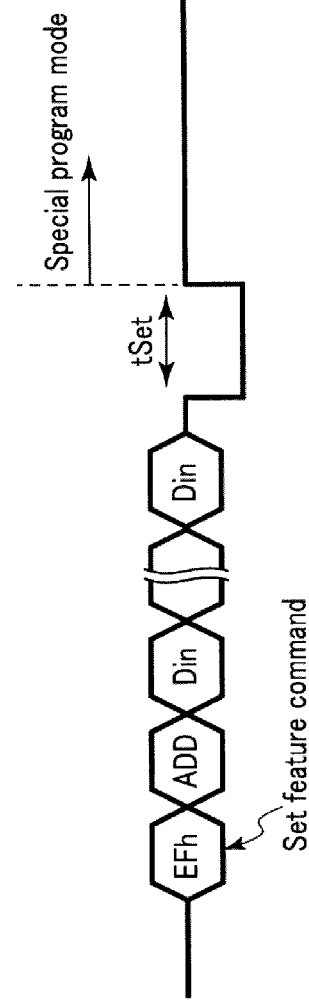
FIG. 27 is a diagram illustrating a command sequence of a setting changing operation in the memory system according to the seventh embodiment.

Here, a command sequence of the set feature will be described with reference to FIG. 27. FIG. 27 illustrates an example of the command sequence of the set feature.

As illustrated in FIG. 27, the controller 20 first issues and transmits a set feature command "EFh" to the semiconductor memory device 10. The command "EFh" is a command for instructing the semiconductor memory device 10 to change a parameter.

Next, the controller 20 issues and transmits the address information ADD to the semiconductor memory device 10. The address information ADD is used to designate an address corresponding to a parameter desired to be changed. Next, the controller 20 outputs the setting data Din to the semiconductor memory device 10 every plural cycles. The data Din output herein corresponds to the parameter to be changed.

Then, the sequencer 17 controls the sense amplifier module 12, the row decoder 13, and the like to start the set feature. When the set feature starts, the setting parameter can rewritten through the same operation as the above-described writing method. As illustrated, tSet indicates a period in which the set feature is executed.

When the set feature ends, the semiconductor memory device 10 enters, for example, a special writing mode. The special writing mode is a mode in which the write operation of the foregoing embodiments is executed in accordance with the command sequence of the first write operation described in FIG. 25. That is, in the special writing mode, the semiconductor memory device 10 executes the write operation of the foregoing embodiments without receiving the special command.

[7-2] Advantages of Seventh Embodiment

Next, the advantages of the seventh embodiment will be described. The memory system 1 according to the seventh embodiment can improve an operation speed of the memory system 1. The details of the advantages will be described below.

As the data stored in the memory system, there are data of which a rewriting frequency is high and data of which a rewriting frequency is low. For example, image data can be exemplified as the data of which the rewriting frequency is low, and document data can be exemplified as the data of which the rewriting frequency is high. For either data, an error at the time of reading is preferably small.

An operation speed of a write operation in which reliability is enhanced is lower than an operation speed of a normal write operation in some cases. For data of which the rewriting frequency is high, an operation speed may be prioritized even if a few fail-bits are allowed.

Accordingly, the memory system 1 according to the present embodiment properly uses a data writing method according to data to be written. Specifically, data written by an external host is determined, an instruction is given to the controller 20, and the controller 20 issues a writing command based on the instruction of the host. For example, when an operation speed is prioritized, a normal writing command (80h) is used as the command. When reliability of data is prioritized, a special command (xxh+80h) is used.

Based on the writing command, the semiconductor memory device 10 executes a write operation in which the operation speed is prioritized or a write operation in which the reliability of the data is prioritized. For example, the normal writing method is applied to the write operation in which the operation speed is prioritized. For example, the writing method of the first embodiment is applied to the write operation in which the reliability is prioritized.

In this way, the semiconductor memory device 10 according to the seventh embodiment can properly use the different writing methods in accordance with the command issued by the controller 20. In this way, in the semiconductor memory device 10 according to the seventh embodiment, the user can select a preferable item between the operation speed and the reliability of the data in the write operation.

The writing method described in the foregoing embodiments may be executed by changing default setting in accordance with the set feature. In this case, the set feature is executed in all of the write operation according to data to be written. In this way, the semiconductor memory device 10 can write data in accordance with an appropriate writing method without receiving a special command.

The kind of special command is not limited to the above command, but two or more kinds of special commands may be used. Even in this case, similarly, by allocating different writing methods to special commands, it is possible to select a writing method suitable for use.

[8] Eighth Embodiment

Next, a semiconductor memory device according to an eighth embodiment will be described. In the eighth embodiment, the configuration of the memory cell array in the foregoing embodiments is changed to a configuration in which memory cells are stacked. Hereinafter, differences from the first to seventh embodiments will be described.

[8-1] Configuration of Semiconductor Memory Device 10

[8-1-1] Circuit Configuration of Memory Cell Array 11

Figure 28:
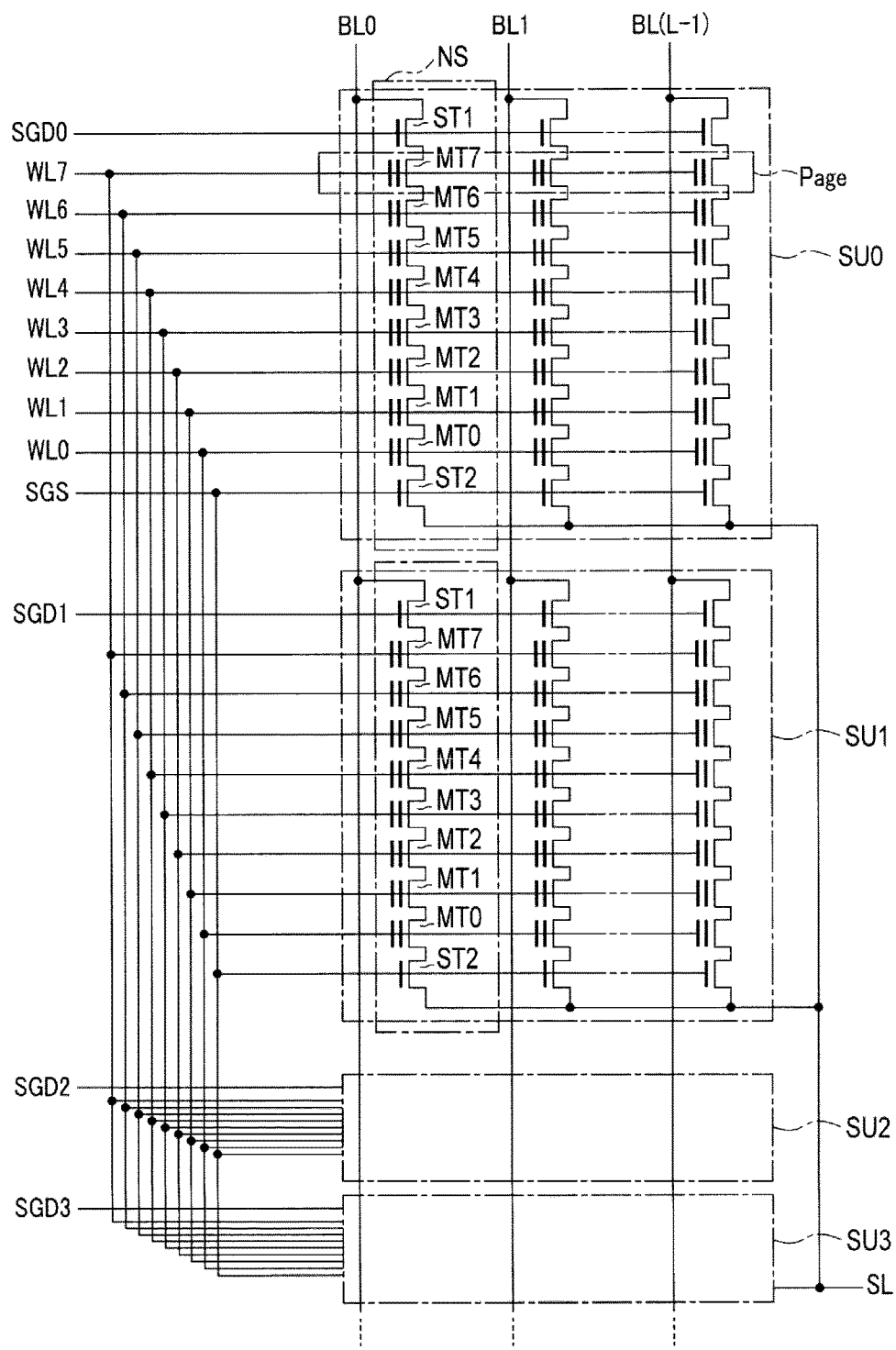
FIG. 28 is a circuit diagram illustrating a memory cell array in a semiconductor memory device according to an eighth embodiment.

The circuit configuration of the memory cell array 11 will be described with reference to FIG. 28. FIG. 28 is a circuit diagram illustrating the memory cell array 11. The circuit configuration of the semiconductor memory device 10 in which the memory cells are stacked three-dimensionally is different from the configuration of the blocks BLK described in FIG. 3 in the first embodiment. Hereinafter, the circuit configuration will be described using one block BLK.

The block BLK includes, for example, four string units SU. Each of the string unit SU includes L NAND strings NS (where L is a natural number equal to or greater than 1). The configuration of the NAND string NS is the same as that described in FIG. 3 in the first embodiment.

The gates of the select transistors ST1 in the string units SU0 to SU3 are connected commonly to the select gate lines SGD0 to SGD3. The gates of the select transistors ST2 in the same block are connected commonly to a select gate line SGS. Similarly, control gates of memory cell transistors MT0 to MT7 in the same block are connected commonly to word lines WL0 to WL7, respectively.

The drains of the select transistors ST1 of the NAND strings NS in the same column in the memory cell array 11 are connected commonly to the bit line BL. That is, the bit line BL commonly connects the NAND strings NS in the same column between the plurality of blocks BLK. Further, the sources of the plurality of select transistors ST2 are connected commonly to the source line SL.

[8-1-2] Cross-Sectional Configuration of Memory Cell Array 11

Figure 29:
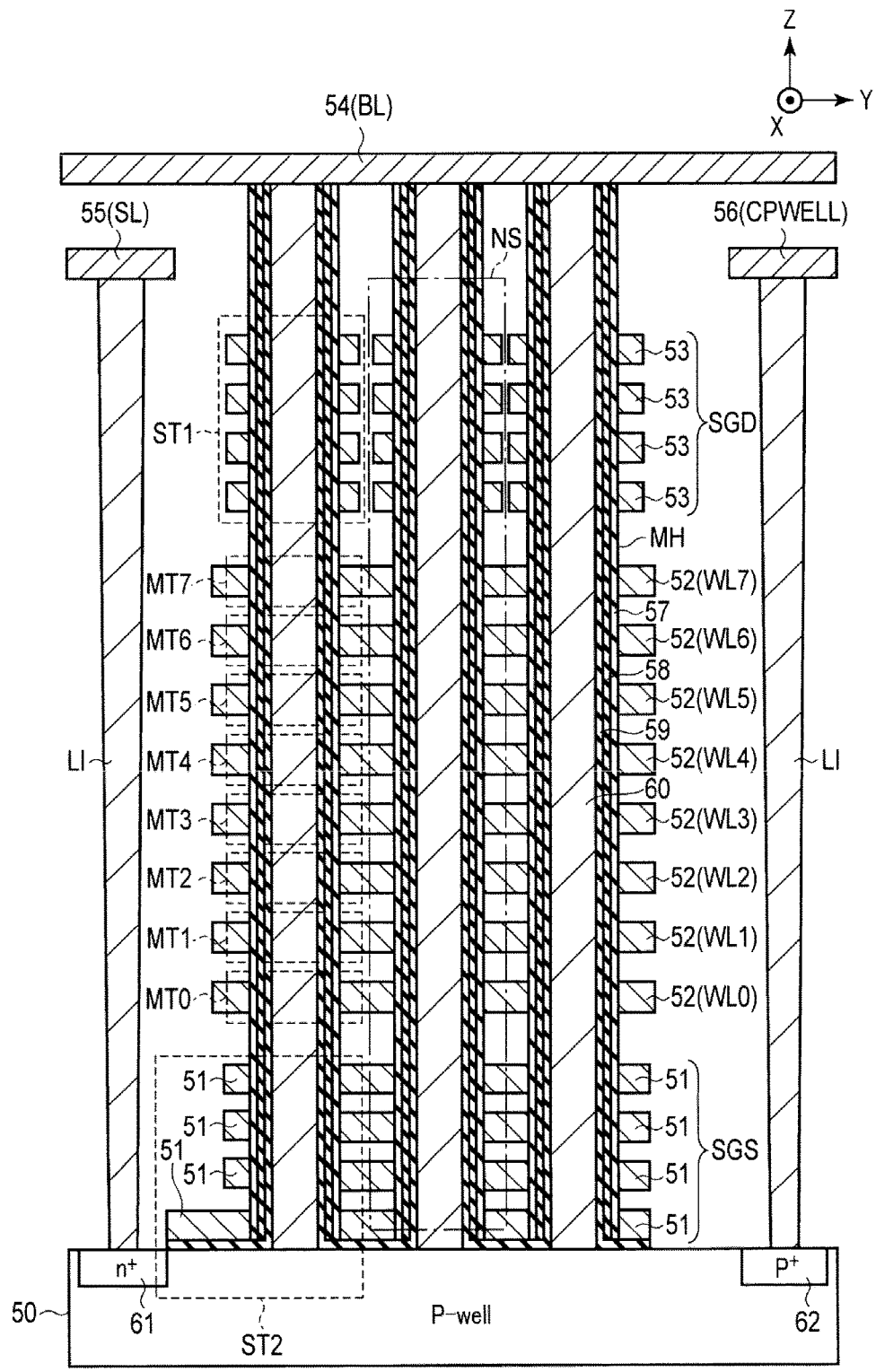
FIG. 29 is a sectional view illustrating the memory cell array in the semiconductor memory device according to the eighth embodiment.

Next, the cross-sectional configuration of the memory cell array 11 will be described with reference to FIG. 29. FIG. 29 illustrates the cross-sectional diagram of the memory cell array 11 and the X, Y, and Z axes that go straight. In FIG. 29, inter-layer insulation films are not illustrated.

As illustrated in FIG. 29, the semiconductor memory device 10 includes a P-well region 50, writing layers 51 to 56, a plurality of semiconductor pillars MH, and a plurality of contact plugs LI.

The P-well region 50 is formed on the surface of the semiconductor substrate. The wiring layers 51 to 53 are stacked in order above the P-well region 50. The wiring layers 51 to 53 function as the select gate line SGS, the word line WL, and the select gate line SGD, respectively. That is, the number of layers of the wiring layers 51 to 53 corresponds to the number of select gate line SGS, word line WL, and select gate line SGD.

The plurality of wiring layers 51 and 53 corresponding to the select gate lines SGS and SGD may be provided, as illustrated in FIG. 29. The wiring layers 51 to 53 are provided in a plate shape extending in the X and Y directions.

The plurality of semiconductor pillars MH are formed to reach the upper surface of the P-well region 50 from the upper surface of the wiring layer 53. That is, the semiconductor pillars MH are provided to pass through the wiring layers 51 to 53 in the Z direction. A block insulation film 57, an insulation film (charge storage layer) 58, and a tunnel oxide film 59 are formed in order on the side surface of the semiconductor pillars MH. On the inner side more than the tunnel oxide film 59, a semiconductor material 60 including a conductive material is embedded in the semiconductor pillars MH.

Wiring layers 54 corresponding to the bit lines BL are formed above the wiring layer 53 and the semiconductor pillars MH. The bit lines BL are connected to the corresponding semiconductor pillars MH. Further, contact plugs including a conductive material may be formed between the bit lines BL and the corresponding semiconductor pillars MH.

Wiring layers 55 and 56 respectively corresponding to a source line SL and a well line CPWELL are formed between the wiring layers 53 and 54. The source line SL is connected to an $n^+$ impurity diffusion area 61 formed in the surface of the well region 50 with the contact plugs LI interposed therebetween. The well line CPWELL is connected to the $p^+$ impurity diffusion area 62 formed in the surface of the well region 50 with the contact plugs LI interposed therebetween. The contact plugs LI are formed in a plate shape extending in the X and Z directions.

In the foregoing configuration, one semiconductor pillar MH corresponds to one NAND string NS. Specifically, intersections between the select gate lines SGD and SGS, and the semiconductor pillars MH correspond to the select transistors ST1 and ST2, respectively. Similarly, intersections between the word lines WL and the semiconductor pillars MH correspond to the memory cell transistors MT.

The plurality of configurations described above are arrayed in the X direction. For example, one string unit SU includes a set of the plurality of NAND strings NS arrayed in the X direction. When the plurality of string units SU are provided in the same block BLK, the wiring layers 53 corresponding to the select gate lines SGD are separated between the string units SU.

The wiring layer 51 and the tunnel oxide film 59 in the lowermost layer are provided up to the vicinity of the n+ impurity diffusion area 61. In this way, when the select transistor ST2 is turned on, a current path is formed between the NAND string NS and the n+ impurity diffusion area 61.

The configuration of the memory cell array 11 may have a different configuration, such as the ones disclosed in, for example, U.S. patent application Ser. No. 12/407,403, filed on Mar. 19, 2009, titled "THREE-DIMENSIONALLY STACKED NONVOLATILE SEMICONDUCTOR MEMORY DEVICE," in U.S. patent application Ser. No. 12/406,524, filed on Mar. 18, 2009, titled "THREE-DIMENSIONALLY STACKED NONVOLATILE SEMICONDUCTOR MEMORY," in U.S. patent application Ser. No. 12/679,991, filed on Mar. 25, 2010, titled "NONVOLATILE SEMICONDUCTOR MEMORY DEVICE AND MANUFACTURING METHOD THEREFOR," and in U.S. patent application Ser. No. 12/532,030, filed on Mar. 23, 2009, titled "SEMICONDUCTOR MEMORY AND MANUFACTURING METHOD THEREFOR." The entire contents of these patent applications are incorporated by reference in the present specification.

[8-2] Advantages of Eighth Embodiment

Next, the advantages of the eighth embodiment will be described. The semiconductor memory device 10 according to the eighth embodiment can improve the reliability of the data even in the semiconductor memory device in which memory cells are stacked three-dimensionally. The details of the advantages will be described below.

When the program voltage is applied to the memory cells in the write operation of the semiconductor memory device, an increase amount of the threshold voltage is determined depending on the characteristics of the memory cells. For example, the characteristics are different between when a conductive layer is applied to the memory cell and when an insulation layer is applied to the memory cell. Further, the characteristics are different between when the memory cells are arrayed in a plane and when the memory cells are stacked three-dimensionally. Therefore, when the memory cells are stacked three-dimensionally, it is necessary to adjust the program voltage more precisely in some cases.

Accordingly, the write operation of the first to seventh embodiments is applied to the semiconductor memory device in which the memory cells are stacked three-dimensionally. The write operation of the embodiments can be operated similarly not only in a semiconductor memory device in which memory cells are formed on a plane but also in a semiconductor memory device in which memory cells are stacked three-dimensionally.

In this way, in the semiconductor memory device 10 according to the eighth embodiment, it is possible to obtain the same advantages as those of the foregoing embodiments by applying the writing method according to the foregoing embodiments.

[9] Modification Examples

The semiconductor memory device <10, FIG. 1> according to the foregoing embodiments includes the plurality of first memory cells <MC, FIG. 3> that are capable of storing the data of 2 bits or more and the first word lines <WL> that are connected to the plurality of first memory cells. In the write operation, the program loop including the program operation <Program, FIG. 6> of applying the program voltage <Vpgm, FIG. 6> to the first word lines is repeated. The write operation includes the first period <1st phase, FIG. 6> includes the program loop of the plural times and the second period <2nd phase, FIG. 6> continuing from the first period. The program voltage is increased by the first voltage <ΔVpgm1, FIG. 6> for each program loop during the first period and is increased by the second voltage <ΔVpgm2, FIG. 6> lower than the first voltage for each program loop during the second period.

In this way, it is possible to provide the semiconductor memory device capable of improving the reliability of the data.

Embodiments are not limited to the foregoing first to eighth embodiments, but may be modified in various forms. For example, when the memory cell stores data of 3 bits or more as in the sixth embodiment, ΔVpgm may be changed in three steps or more. That is, during the write operation, three kinds or more of ΔVpgm may be used. Even in this case, as in the foregoing embodiments, ΔVpgm in the subsequent loops of the write operation is set to decrease.

In the foregoing embodiments, for example, the verifying voltage is increased step by step in the verifying operation, as described above. However, an embodiment is not limited thereto. For example, by increasing the voltage continuously, the verifying voltage may be generated. In this case, the verifying voltage is a voltage value at a timing at which the sense amplifier module 12 senses the voltage of the bit line BL. The number of times the verifying voltage is applied corresponds to the number of times the voltage of the bit line BL is sensed at the time of the verifying operation.

In the foregoing embodiments, for example, the verifying operation is continuously executed at a plurality of levels, as described above. However, an embodiment is not limited thereto. For example, the verifying at each level may be divided. For example, the application order of the verifying voltages is the ascending order from the low voltages in the verifying, as described above. However, an embodiment is not limited thereto, but the order may be switched.

In the fifth embodiment, the counter that counts the number of times the program loop is executed counts the number of times by increasing the numerical value, but an embodiment is not limited thereto. For example, the counter may count the number of program loops by decreasing the numerical value of the counter. In this case, for example, in the fifth embodiment, N=k is set in the counter instead of the reset operation of the counter described in step S40. Then, in step S41, the sequencer 17 determines whether N=0 is satisfied. In step S42, the counter is decreased. Accordingly, as in the case of the increase in the counter, $\Delta$Vpgm may be changed after the program loop is executed a desired number of times.

In the foregoing embodiments, for example, the pass finally results in the verifying, as described above. However, an embodiment is not limited thereto. For example, when the program loop is executed by a regulated number of times and the pass does not result in the verifying, the write operation of that page may be assumed to have failed.

In the seventh embodiment, the command sequence is described, for example, when the sequential writing of 2-page data is executed. However, even when the sequential writing of data of 3 pages or more is executed, the same command sequence is used. For example, the controller 20 may transmit corresponding information for each page to the semiconductor memory device 10 and executes the sequential writing in accordance with the command "10h" for data of a desired number of pages. That is, the one-time write operation can be said to be executed based on information transmitted between the writing command "80h" first transmitted and the command "10h" for executing the write operation.

In the foregoing description, "connection" indicates electrical connection and includes not only a direct connection case but also connection via any element.

The ready/busy control circuit 18 may not be used as a unit by which the controller 20 knows an operation state of the semiconductor memory device 10. In this case, the sequencer 17 stores a ready/busy information corresponding to a ready/busy signal in the status register 15A. Accordingly, when the controller 20 issues a status read command, this information is read from the status register 15A and is output to the input and output circuit 14. In this way, the controller 20 can know the operation state of the semiconductor memory device 10.

In the foregoing embodiments, the data erasing unit may be changed from a block BLK. For example, other data erasing units are disclosed in U.S. patent application Ser. No. 13/235,389, filed on Sep. 18, 2011, titled "NONVOLATILE SEMICONDUCTOR MEMORY DEVICE," and in U.S. patent application Ser. No. 12/694,690, filed on Jan. 27, 2010, titled "NONVOLATILE SEMICONDUCTOR MEMORY DEVICE." The entire contents of these patent applications are incorporated by reference in the present specification.

In the foregoing embodiments, (1) the voltage applied to the word lines selected in the read operation of the "A" level is in the range of, for example, 0 to 0.55 V. An embodiment is not limited thereto. The voltage may be set as one of 0.1 to 0.24 V, 0.21 to 0.31 V, 0.31 to 0.4 V, 0.4 to 0.5 V, and 0.5 to 0.55 V.

The voltage applied to the word lines selected in the read operation of the "B" level is in the range of, for example, 1.5 to 2.3 V. An embodiment is not limited thereto. The voltage may be set as one of 1.65 to 1.8 V, 1.8 to 1.95 V, 1.95 to 2.1 V, and 2.1 to 2.3 V.

The voltage applied to the word lines selected in the read operation of the "C" level is in the range of, for example, 3.0 V to 4.0 V. An embodiment is not limited thereto. The voltage may be set as one of 3.0 to 3.2 V, 3.2 to 3.4 V, 3.4 to 3.5 V, 3.5 to 3.6 V, and 3.6 to 4.0 V.

The time (tRead) of the read operation may be set as one of, for example, 25 to 38 µs, 38 to 70 µs, and 70 to 80 µs.

(2) The write operation includes the program operation and the verifying operation, as described above. In the write operation, the voltage first applied to the word lines selected at the time of the program operation is between, for example, 13.7 to 14.3 V. An embodiment is not limited thereto. For example, the voltage may be set as one of 13.7 to 14.0 V and 14.0 to 14.6 V.

A voltage first applied to the selected word lines at the time of writing of odd word lines and a voltage first applied to the selected word lines at the time of writing of the even word lines may be switched.

When the program operation is set to an incremental step pulse program (ISPP) scheme, for example, about 0.5 V can be used as a step-up voltage.

The voltage applied to the unselected word lines may be set as a range of, for example, 6.0 to 7.3 V. An embodiment is not limited thereto. For example, the voltage may be set as 7.3 to 8.4 V or may be set as 6.0 V or less.

The pass voltage to be applied may be switched depending on whether the unselected word lines are odd word lines or even word lines.

The time (tProg) of the write operation may be set as one of, for example, 1,700 to 1,800 µs, 1,800 to 1,900 µs, and 1,900 to 2,000 µs.

(3) In the erasing, the voltage applied first to the well which formed above the semiconductor substrate and on which the memory cells are arranged is between, for example, 12 to 13.6 V. An embodiment is not limited thereto. For example, the voltage may be set as one of 13.6 to 14.8 V, 14.8 to 19.0 V, 19.0 to 19.8 V and 19.8 to 21 V.

A time (tErase) of the erasing may be set as one of, for example, 3,000 to 4,000 µs, 4,000 to 5,000 µs, and 4,000 to 9,000 µs.

(4) The structure of the memory cell includes the charge storage layer that is arranged on a semiconductor substrate (silicon substrate) with a tunnel insulation film having a film thickness of 4 to 10 nm therebetween. The charge storage layer can has a stack structure of an insulation film having a film thickness of 2 to 3 nm, such as SiN or SiON, and a polysilicon having a film thickness of 3 to 8 nm. Further, metal such as Ru may be added to the polysilicon. An insulation film is provided above the charge storage layer. This insulation film includes a silicon oxide film that has a film thickness of 4 to 10 nm and is interposed between a High-k film of a lower layer having a film thickness of 3 to 10 nm and a High-k film of an upper layer having a film thickness of 3 to 10 nm. HfO can be exemplified as the High-k film. The film thickness of the silicon oxide film can be set to be thicker than the film thickness of the High-k film. A control electrode having a film thickness of 30 to 70 nm is formed on the insulation film with a material having a film thickness of 3 to 10 nm interposed therebetween. Here, the material is a metal oxide film such as TaO or a metal nitride film such as TaN. In the control electrode, W or the like can be used.

An air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of memory cells;
   a plurality of word lines, including a first word line connected to a group of the memory cells and other word lines connected to the memory cells that are not in the group; and
   a control circuit configured to execute a write operation on the memory cells of the group, wherein
   the write operation includes multiple program loops including a first program loop, and a second program loop that is executed at a later time than the first program loop, and
   each multiple program loop includes a verify operation during which threshold voltages of the memory cells of the group are verified, and a program operation and a detection operation that are carried out in parallel, wherein a program voltage is applied to the first word line during the program operation and pass results of the verify operation are confirmed during the detection operation, the program voltage for a subsequent loop being determined based on the detection operation and increased by a first amount from that of a current program loop if the next program loop is the first program loop and by a second amount that is less than the first amount if the next program loop is the second program loop.

2. The device according to claim 1, wherein
   the multiple program loops further include a third program loop that is executed at a later time than the second program loop, and
   the program voltage is increased by a third amount that is less than the second amount from that of the current program loop if the next program loop is the third program loop.

3. The device according to claim 1, wherein an amount of increase in the program voltage for the subsequent program loop from that of the current program loop is reduced according to a number of program loops that have been executed.

4. The device according to claim 1, wherein an amount of increase in the program voltage for the subsequent program loop from that of the current program loop is reduced if the program voltage for the current program loop is less than a threshold program voltage.

5. The device according to claim 1, wherein
   during the write operation on the memory cells of the group, a write pass voltage, which is less than the program voltage and greater than a ground voltage, is applied to the other word lines, and for each subsequent program loop, the write pass voltage is increased from that of the current program loop, and
   the write pass voltage is increased by a third amount from that of the current program loop if the next program loop is the first program loop and by a fourth amount that is less than the third amount if the next program loop is the second program loop.

6. The device according to claim 1, wherein one of three different verify voltages are applied to the first word line during the verify operation.

7. The device according to claim 1, wherein write one of seven different verify voltages are applied to the first word line during the verify operation.

8. The device according to claim 1, wherein one of fifteen different verify voltages are applied to the first word line during the verify operation.

9. The device according to claim 1, wherein the memory cells are arranged in two-dimensions.

10. The device according to claim 1, wherein the memory cells are arranged in three-dimensions.

11. A method of performing a write operation in multiple program loops in a semiconductor memory device including a plurality of memory cells, and a plurality of word lines including a first word line connected to a group of the memory cells and other word lines connected to the memory cells that are not in the group, said method comprising:
    (a) executing a first program operation on the memory cells in the group by applying a program voltage to the first word line;
    (b) executing a verify operation to determine threshold voltage levels of the memory cells in the group;
    (c) executing a second program operation and a detection operation in parallel, wherein an increased program voltage is applied to the first word line during the second program operation and pass results of the verify operation are confirmed during the detection operation; and
    repeating steps (b) and (c) until each of the memory cells in the group has reached a target threshold voltage thereof,
    wherein one program loop includes steps (b) and (c), and the program voltage for a subsequent program loop is determined based on the detection operation and increased by a first amount from that of a current program loop if the next program loop is a first program loop and by a second amount that is less than the first amount if the next program loop is a second program loop which is executed at a later time than the first program loop.

12. The method of claim 11, wherein
    the program voltage for the subsequent program loop is increased by a third amount that is less than the second amount from that of the current program loop if the next program loop is a third program loop which is executed at a later time than the second program loop.

13. The method of claim 11, wherein an amount of increase in the program voltage is reduced according to a number of program loops that have been executed.

14. The method of claim 11, wherein an amount of increase in the program voltage is reduced if the program voltage for the current program loop is less than a threshold program voltage.

15. The method of claim 11, wherein
during each program operation, applying a write pass voltage, which is less than the program voltage and greater than a ground voltage, to the other word lines, and for each subsequent program loop, the write pass voltage is increased from that of the current program loop, and the write pass voltage is increased by a third amount from that of the current program loop if the next program loop is the first program loop and by a fourth amount that is less than the third amount if the next program loop is the second program loop.

16. The method of claim 11, wherein one of three different verify voltages are applied to the first word line during the verify operation.

17. The method of claim 11, wherein one of seven different verify voltages are applied to the first word line during the verify operation.

18. The method of claim 11, wherein one of fifteen different verify voltages are applied to the first word line during the verify operation.

* * * * *